(12) United States Patent
Muraki et al.

(10) Patent No.: US 8,749,123 B2
(45) Date of Patent: Jun. 10, 2014

(54) PIEZOELECTRIC DEVICE

(75) Inventors: Yoichi Muraki, Tokyo (JP); Tomohiro Ohya, Tokyo (JP); Atsushi Muraoka, Shiga (JP); Hiroyuki Miura, Shiga (JP)

(73) Assignee: Kyocera Kinseki Corporation, Tokyo (JP)

( * ) Notice: Subject to any disclaimer, the term of this patent is extended or adjusted under 35 U.S.C. 154(b) by 297 days.

(21) Appl. No.: 13/074,672

(22) Filed: Mar. 29, 2011

(65) Prior Publication Data

US 2011/0234047 A1  Sep. 29, 2011

(30) Foreign Application Priority Data

Mar. 29, 2010 (JP) ................. 2010-074976
Sep. 30, 2010 (JP) ................. 2010-222307
Sep. 30, 2010 (JP) ................. 2010-222311
Nov. 30, 2010 (JP) ................. 2010-267448
Dec. 28, 2010 (JP) ................. 2010-292323

(51) Int. Cl.
*H03H 9/10* (2006.01)

(52) U.S. Cl.
USPC ............................ 310/346; 310/348

(58) Field of Classification Search
CPC ......... H03H 9/17; H03H 9/172; H01L 41/053
USPC .................................. 310/346, 348
See application file for complete search history.

(56) References Cited

U.S. PATENT DOCUMENTS

| | | | |
|---|---|---|---|
| 5,500,628 A | 3/1996 | Knecht | |
| 6,229,249 B1* | 5/2001 | Hatanaka et al. | 310/348 |
| 2001/0019292 A1 | 9/2001 | Funahara et al. | |
| 2007/0024161 A1* | 2/2007 | Koyama et al. | 310/348 |

FOREIGN PATENT DOCUMENTS

| | | |
|---|---|---|
| EP | 0 969 591 A1 | 1/2000 |
| JP | 07-106903 A | 4/1995 |
| JP | 08-078955 A | 3/1996 |
| JP | 08-204452 A | 8/1996 |
| JP | 09-098024 A | 4/1997 |
| JP | 10-322129 A | 12/1998 |
| JP | 11-103233 A | 4/1999 |
| JP | 2000-151283 A | 5/2000 |
| JP | 2001-077627 A | 3/2001 |

(Continued)

OTHER PUBLICATIONS

English translation of Japanese Office Action dated May 2, 2012, issued in corresponding Japanese Patent Application No. 2010-074976 (3 pages).

(Continued)

*Primary Examiner* — Derek Rosenau
(74) *Attorney, Agent, or Firm* — Westerman, Hattori, Daniels & Adrian, LLP

(57) ABSTRACT

A piezoelectric device has a plate-shaped substrate, a first frame defining a first concave portion at one surface of the substrate, a second frame defining a second concave portion at the other surface of the substrate, a first electrode member provided at one surface of the substrate, a second electrode member provided at the other surface of the substrate, a piezoelectric unit in which a first electrode section of the piezoelectric vibration plate is fixed to the first electrode member by a conductive binder, a cover sealing the first concave portion, and a temperature detection unit in which a second electrode section of the thermistor element is fixed to the second electrode member by a conductive joining material.

11 Claims, 20 Drawing Sheets

(56) References Cited

FOREIGN PATENT DOCUMENTS

| | | | |
|---|---|---|---|
| JP | 2001-127579 A | 5/2001 |
| JP | 2002-076775 A | 3/2002 |
| JP | 2002-217645 A | 8/2002 |
| JP | 2004-343338 A | 12/2004 |
| JP | 2005-020546 A | 1/2005 |
| JP | 2005-286892 A | 10/2005 |
| JP | 2006-042278 A | 2/2006 |
| JP | 2006-339943 A | 12/2006 |
| JP | 2007-043338 A | 2/2007 |
| JP | 2007-189378 A | 7/2007 |
| JP | 2008-187751 A | 8/2008 |
| JP | 2008-205938 A | 9/2008 |
| JP | 2008-263564 A | 10/2008 |
| JP | 2008-278110 A | 11/2008 |
| JP | 2009-060335 A | 3/2009 |
| JP | 2010-035077 A | 2/2010 |
| JP | 2010-118979 A | 5/2010 |

OTHER PUBLICATIONS

English translation of Japanese Office Action dated Jul. 12, 2012, issued in corresponding Japanese Patent Application No. 2010-222307 (6 pages).

English translation of Japanese Office Action dated Jul. 12, 2012, issued in corresponding Japanese Patent Application No. 2010-222311 (6 pages).

English translation of Japanese Office Action dated Jan. 19, 2012, issued in corresponding Japanese Patent Application No. 2010-074976 (3 pages).

English translation of Japanese Office Action dated Oct. 1, 2012, issued in corresponding Japanese Patent Application No. 2010-292323 (7 pages).

* cited by examiner

PIEZOELECTRIC DEVICE

BACKGROUND OF THE INVENTION

1. Field of Invention

The present invention relates to a piezoelectric device having a temperature detection function.

2. Description of the Related Art

A piezoelectric device has a quartz or other piezoelectric vibration element and outputs an oscillation signal.

The frequency of the oscillation signal changes in accordance with the pressure which is applied to the piezoelectric device.

An electronic apparatus which is connected to a piezoelectric device can detect the pressure value from the change of the frequency of the oscillation signal.

Incidentally, the oscillation frequency of a piezoelectric device has a temperature characteristic and changes also according to temperature.

Japanese Unexamined Publication (Kokai) No. 2008-205938 (hereinafter referred to as Publication) discloses a piezoelectric device which has a thermistor element.

By utilizing the piezoelectric device disclosed in the Publication, it is possible to compensate the temperature characteristic of the oscillation frequency.

However, the piezoelectric device in the Publication suffers from the disadvantage on mounting.

The mounting area (space) of the piezoelectric device increases since the thermistor element and the piezoelectric vibration element are arranged in a plane.

SUMMARY OF THE INVENTION

In a piezoelectric device having the function of detecting the temperature by a temperature detection unit, such as a thermistor element, therefore, further improvement has been demanded.

According to the present invention, there is provided a piezoelectric device including: a plate-shaped substrate made of an insulating material; a first frame defining a first concave portion in one surface of the plate-shaped substrate; a second frame defining a second concave portion in the other surface of the plate-shaped substrate; a first electrode member provided on one surface of the substrate to expose in the first concave portion; a second electrode member provided on the other surface of the substrate to expose in the second concave portion; a piezoelectric unit having a piezoelectric vibration plate and a first electrode section which is formed at one end of the piezoelectric vibration plate, the first electrode section being fixed to the first electrode member by a conductive joining material or conductive binder; a cover fixed to the first frame to seal the first concave portion which has the piezoelectric unit arranged therein; and a temperature detection unit having a plate-shape, and having at least a thermistor element and a second electrode section of the thermistor element, the second electrode section being fixed to the second electrode member by a conductive joining material or conductive binder.

In the present invention, the piezoelectric unit and the thermistor element of the temperature detection unit are arranged in separate spaces, i.e., the first concave portion and the second concave portion, separately. As a result, in the present invention, the first concave portion and the second concave portion are made smaller, so the piezoelectric device can be made small in size. Further, the gas generated by heating from the conductive joining material or conductive binder to fasten the temperature detection unit is not deposited on the piezoelectric unit. Further, the gas generated by heating from the conductive joining material or conductive binder to fasten the piezoelectric unit is not deposited on the temperature detection unit.

In the present invention, the substrate is exposed both at the first concave portion and the second concave portion. The temperature of the first concave portion and the temperature of the second concave portion are controlled by the substrate to be equal to the temperature of the environment around the piezoelectric device, for example. As a result, the temperature of the first concave portion which has the piezoelectric vibration element arranged therein and the temperature of the second concave portion which has the temperature detection unit arranged therein, are adjusted to the same temperature.

DESCRIPTION OF THE PREFERRED EMBODIMENTS

The above features and/or efforts of the present invention will be described in more detail, with reference to the accompanying drawings. In embodiments of the present invention, as example, the piezoelectric devices use quartz for piezoelectric vibration elements.

First Embodiment

Figure 1:
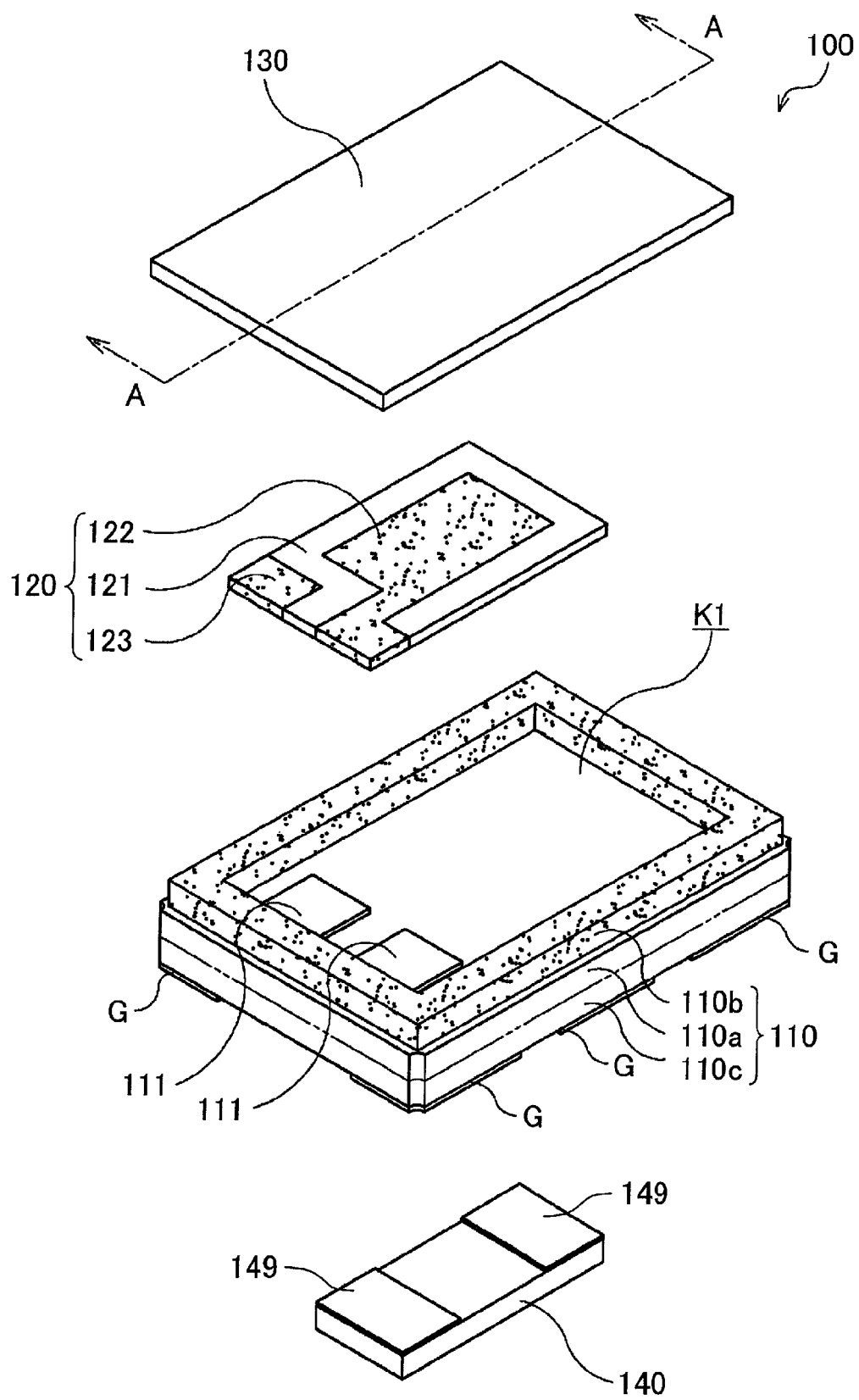
FIG. 1 is a disassembled perspective view of a piezoelectric device of a first embodiment of the present invention.
Figure 2:
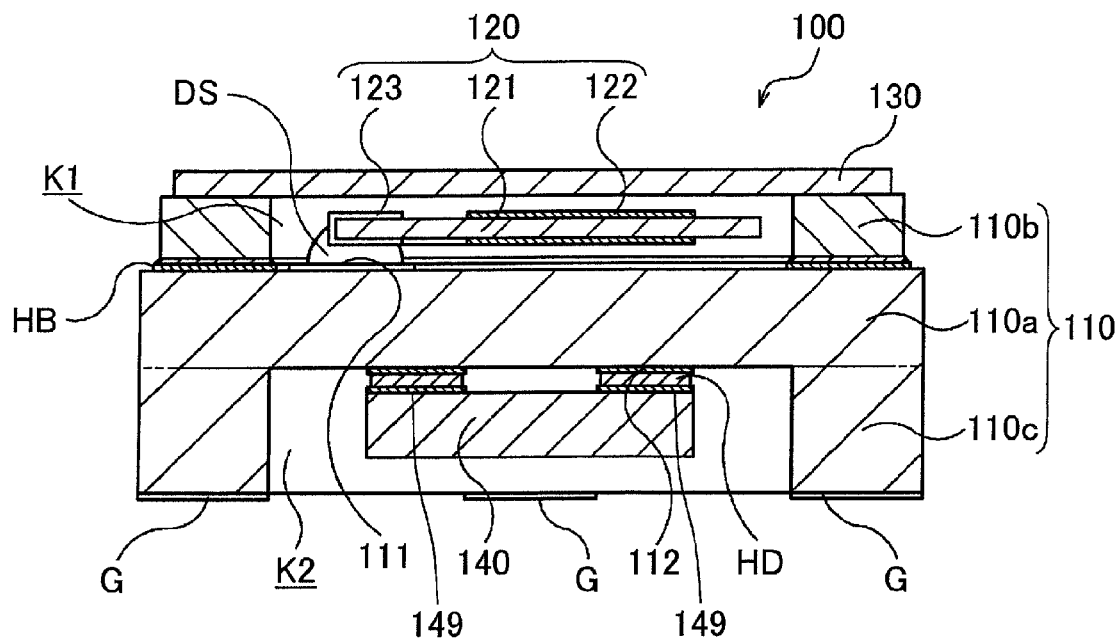
FIG. 2 is a cross-sectional view of the piezoelectric device along with A-A in FIG. 1.
Figure 3:
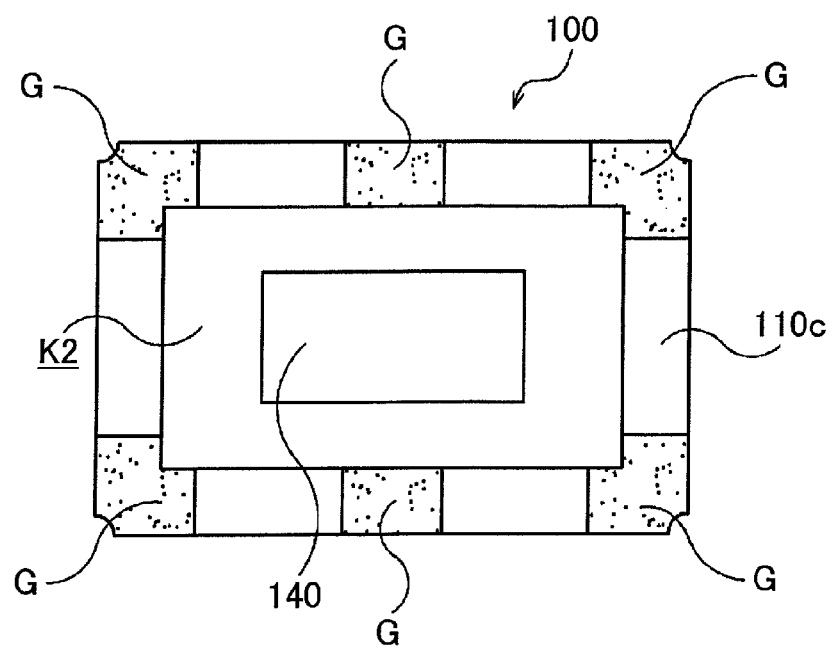
FIG. 3 is a plan view of the piezoelectric device of FIG. 1 viewing from the side of the second concave portion.

FIGS. 1 to 3 are views of a piezoelectric device 100 of a first embodiment of the present invention.

The piezoelectric device 100 of this embodiment, as shown in FIGS. 1 and 2, has an element arrangement member 110, a piezoelectric vibration element 120, a cover 130, and a thermistor element 140.

In the element arrangement member 110, a first concave portion K1 and a second concave portion K2 are formed.

The piezoelectric vibration element 120 is arranged in the first concave portion K1.

The first concave portion K1 is air-tightly sealed by the cover 130.

The thermistor element 140 is arranged in the second concave portion K2.

The element arrangement member 110, as shown in FIGS. 1 to 3, has a substrate portion 110a, a first frame portion 110b, and a second frame portion 110c.

The substrate portion 110a has a rectangular plate shape. The two surfaces of the plate form a pair of major surfaces.

The second frame portion 110c has a frame shape formed by punching out the center of a rectangular plate.

The substrate portion 110a and the second frame portion 110c are formed by stacking plurality sheets of ceramic material of alumina ($Al_2O_3$) ceramic, or glass-ceramic, for example.

The first frame portion 110b has a frame shape formed by punching out the center of a rectangular plate.

The first frame portion 110b is made of an alloy having a composition containing 58% of Fe and 42% of Ni (product name 42Alloy, hereinafter referred to as "42Alloy") or an alloy having a composition containing 54% of Fe, 29% of Ni, and 17% of Co (product name Kovar, hereinafter referred to as "Kovar"), for example.

The first frame portion 110b is jointed on one major surface of the substrate portion 110a by brazed to a film-shaped conductive sealing pattern HB which is disposed on the surface along with the outer circumferential edge of the substrate portion 110a, for example.

On the one major surface of the substrate portion 110a in the side of the piezoelectric vibration element 120, the first frame portion 110b is arranged. Due to this, the first concave portion K1 of the element arrangement member 110 is defined.

On the one major surface of the substrate portion 110, a pair of two arrangement pads 111 for piezoelectric vibration element is formed to be exposed in the first concave portion K1.

At the other major surface of the substrate portion 110a in the side of the thermistor element 140, the second frame portion 110c is arranged. Due to this, the second concave portion K2 of the element arrangement member 110 is defined.

As shown in FIGS. 1 to 3, the second concave portion K2 is formed by the other major surface of the substrate portion 110a and the second frame portion 110c.

On the other major surface of the substrate portion 110, a pair of two arrangement pads 112 for the thermistor element is formed to be exposed in the second concave portion K2.

In a case where the element arrangement member 110 is formed by alumina ceramic, the element arrangement member 110 can be formed by the following steps, for example.

First, an additive such as an organic solvent is added to and mixed with a predetermined ceramic material powder. A ceramic green sheet is formed.

Next, the surface of the ceramic green sheet is coated by screen printing with a conductor paste to be formed as arrangement pads 111 for the piezoelectric vibration element, arrangement pads 112 for the thermistor element, a film-shaped conductive sealing pattern HB, and electrode terminals G for external connections.

Further, the ceramic green sheet is punched, then a conductor paste is coated by screen printing to form via-conductors over the perforated through holes.

Next, a predetermined number of ceramic green sheets are stacked, press-formed, and burned at a high temperature.

The piezoelectric vibration element 120, as shown in FIGS. 1 and 2, has a quartz plate 121 and excitation electrode sections 122.

The quartz plate 121 is formed by cutting a manmade crystal at a predetermined cut angle and machining the outer shape to be in a rectangular plate shape, for example.

The excitation electrode sections 122 are metal coating films formed in predetermined patterns on the two front and back major surfaces of the quartz plate 121. The excitation electrode sections 122 are formed to cover the quartz plate 121.

The piezoelectric vibration element 120 is arranged in the first concave portion K1 of the element arrangement member 110.

The lead out electrodes 123, which are extended from the excitation electrode sections 122 of the piezoelectric vibration element 120, and the arrangement pads 111, which are formed at the bottom surface of the first concave portion K1 for the piezoelectric vibration element, are electrically and mechanically connected by a conductive binder DS.

The free end of the connected piezoelectric vibration element 120, which is opposite side to the lead out electrode section 123, becomes the front end portion of the piezoelectric vibration element 120.

In a case where an alternating voltage is applied to the excitation electrode sections 122, the quartz plate 121 is excited at the predetermined excitation mode and frequency.

Further, in a case where a pressure is applied, the quartz plate 121 is deformed to change the oscillation frequency.

The conductive binder DS is comprised of a binder of silicone resin containing a conductive filler of a conductive powder, for example.

The conductive powder is made of at least one kind of material selected from among aluminum (Al), molybdenum (Mo), tungsten (W), platinum (Pt), palladium (Pd), silver (Ag), titanium (Ti), nickel (Ni), and nickel iron (NiFe), for example.

A pair of connection portions of the piezoelectric vibration element 120 are joined to the arrangement pads 111 for the piezoelectric vibration element by the conductive binder DS.

The cover 130 is made of a magnetic metal material like 42Alloy or Kovar, for example.

The cover 130 is fixed to the first frame portion 110b.

The first concave portion K1 is air-tightly sealed with an inert gas, for example, nitrogen gas. Alternatively, the first concave portion K1 is air-tightly sealed in a vacuum state.

Specifically, the cover 130 is placed on the first frame portion 110b in an atmosphere of the above gas.

In this state, a predetermined current is provided between the metal of the surface of the first frame portion 110b and a portion of the metal of the cover 130. The cover 130 is seamed and welded to the first frame portion 110b.

When the pressure is applied to the cover 130, the internal pressure of the first concave portion K1 raises. Due to this, the oscillation frequency of the piezoelectric vibration element 120 changes.

The piezoelectric device 100 outputs a signal with the oscillation frequency.

The piezoelectric device 100 is connected to an electronic apparatus. The electronic apparatus detects the pressure value applied to the cover 130 based on the change of the frequency of the oscillation signal.

Even when the pressure applied to the cover 130 is reduced, the oscillation frequency changes, and the pressure can be detected by the electronic apparatus.

The thermistor element 140 changes its electrical resistance remarkably in accordance with the change of the temperature.

The thermistor element 140 is arranged in the second concave portion K2 of the element arrangement member 110.

The thermistor element 140, as shown in FIG. 2, has a pair of electrode sections 149 at the two ends of its rectangular outer shape.

The pair of electrode sections 149 are joined to the arrangement pads 112 exposed in the second concave portion K2 for the thermistor element by a conductive joining material HD like solder, for example.

The output voltage of the thermistor element 140 is output to the outside of the piezoelectric device 100 through the electrode terminal G for the external connection.

To detect the temperature, a schematically linear relationship range is used of the voltage and the temperature of the thermistor element 140, for example.

The thermistor element 140 is connected to a main IC of the electronic apparatus, for example. The main IC is connected to the electrode terminal G.

The electronic apparatus applies a voltage to the thermistor element 140.

The electronic apparatus, to detect temperature information, converts the output voltage of the thermistor element 140 to a corresponding temperature value based on the previously measured or predetermined relationship between the voltage and temperature.

The second frame portion 110c has four external connection electrode terminals G.

The four external connection electrode terminals G are formed at the four corner portions of the back surface of the element arrangement member 110. The back surface is the opposite side (back side) to the side where the arrangement pads 111 for the piezoelectric vibration element is arranged.

The arrangement pads 111 for the piezoelectric vibration element are electrically connected with a part of the external connection electrode terminals G by both of interconnect patterns formed in the substrate portion 110a and the via-conductors formed in the second frame portion 110c.

The arrangement pads 112 for the thermistor element are electrically connected with the rest of the external connection electrode terminals G by both of interconnect patterns formed in the substrate portion 110a and the via-conductors formed in the second frame portion 110c.

The piezoelectric device 100 is mounted on a printed circuit board of a electronic apparatus. The external connection electrode terminals G are soldered to the printed circuit board. In the mounted position, the second concave portion K2 is located at the bottom side of the piezoelectric device 100.

In the state where the device is mounted on the printed circuit board, the second concave portion K2 is in a schematically sealed state by the second frame portion 110c and the printed circuit board.

In this embodiment, as described above, a space for the piezoelectric vibration element 120 and a space for the thermistor element 140 are provided individually in vertical layout at the top and the bottom of the piezoelectric device 100, therefore the dimensions of the first concave portion K1 can be made small in the plane.

As a result, in this embodiment, both of the area of the first concave portion K1 and the area of the second concave portion K2 can be made small. Since the spaces are small, temperature gradients in the spaces can be suppressed.

Further, the mounting area of the piezoelectric device 100 of this embodiment can be reduced as to be the same size of a device without a thermistor element 140, even though the piezoelectric device 100 has the thermistor element 140.

Further, in this embodiment, the substrate portion 110a which is made of a ceramic material and having a high thermal conductivity is exposed at the first concave portion K1 and second concave portion K2. The substrate portion 110a is sandwiched between the first frame portion 110b and the second frame portion 110c, and outer circumference surface of the substrate portion 110a is exposed directly to the outside.

In this way, in this embodiment, the substrate portion 110a functions as a heat conduction path and adjusts the temperature of the first concave portion K1 in which the piezoelectric vibration element 120 is arranged and the temperature of the second concave portion K2 in which the thermistor element 140 is arranged to the same temperature as that of the outside.

As a result, the detection temperature converted from the output voltage of the thermistor element 140 and the actual temperature of the periphery of the piezoelectric vibration element 120 approach to the same value (value of the temperature of the outside). The temperature difference of the detection temperature relative to the actual temperature is small.

In this embodiment, the piezoelectric vibration element 120 and the thermistor element 140 are separately arranged in the first concave portion K1 and the second concave portion K2.

Accordingly, even if the gas is generated from the conductive joining material HD for joining the thermistor element 140, the gas is not deposited on the piezoelectric vibration element 120, and so the oscillation frequency does not change.

Further, even if the gas is generated from the conductive binder DS for bonding the piezoelectric vibration element 120, the gas is not deposited on the thermistor element 140, and so the deterioration of the thermistor element due to the gas does not occur.

In this embodiment, the piezoelectric vibration element 120 and the thermistor element 140 are fixed on the front and back major surfaces of the substrate portion 110a and the substrate portion 110a functions as a common heat conduction path. Accordingly, even when the piezoelectric vibration element 120 or thermistor element 140 generates heat, the heat is diffused to the outside by the substrate portion 110a, and hardly any temperature difference occurs between the first concave portion K1 and the second concave portion K2.

In particular, in this embodiment, the substrate portion 110a and the second frame portion 110c are integrally formed by the ceramic material in one process to be exposed their surface directly to the outside, therefore the heat of the piezoelectric vibration element 120 or the thermistor element 140 is radiated effectively from the outer surfaces of the substrate portion 110a and second frame portion 110c.

Further, in this embodiment, the first concave portion K1 is sealed by the cover 130, and the second concave portion K2 is schematically sealed by the printed circuit board. Accordingly, even if the temperature of the first concave portion K1 changes, the temperature of the second concave portion K2 is not stabilized by the ambient air, but changes following to the temperature of the first concave portion K1. The difference of the detection temperature to the actual temperature is therefore suppressed.

As opposed to this embodiment, in a case where the piezoelectric vibration element 120 and the thermistor element 140 are arranged in a horizontal plane within a space, the following disadvantages may occur.

First, the piezoelectric vibration element 120 and the thermistor element 140 are arranged in an alignment; therefore the piezoelectric device becomes large in scale. The mounting area for the piezoelectric device in the printed circuit board increases.

Second, the piezoelectric vibration element 120 and the thermistor element 140 are arranged in a space to be in a horizontal alignment, so the volume of the space becomes large. The piezoelectric device is one kind of electronic portion, so lowering of the height is desired. With a reduced height piezoelectric device, since the height of the space is hard to obtain, the space (size) becomes thin and long, and so a temperature difference occurs within the space.

As a result, due to the temperature gradient within the space, a temperature difference occurs between the temperature of the piezoelectric vibration element 120 and the temperature of the thermistor element 140, for example. In this case, a temperature difference occurs between the detection temperature converted from the output voltage of the thermistor element 140 and the actual temperature of the periphery of the piezoelectric vibration element 120.

Third, in a case where the thermistor element 140 is joined to the element arrangement member 110 by the conductive binder DS or the conductive joining material HD, gas is volatilized from these materials. The ingredients of the volatilized gas are deposited on the piezoelectric vibration element 120, so the mass thereof changes. As a result, the oscillation frequency of the piezoelectric vibration element 120 may change.

Fourth, in a case where the piezoelectric vibration element 120 is joined by the conductive binder DS or the conductive joining material HD, gas is produced due to volatilization of these materials. The ingredients of the gas are deposited on the thermistor element 140 to form a film of the gas ingredients on the surface. As a result, the temperature detection performance of the thermistor element 140 is deteriorated, and the temperature difference from the actual temperature may become large.

The gas generated by volatilization of the conductive binder DS or the conductive joining material HD is generated by heating in the joining process of the thermistor element after sealing the piezoelectric vibration element 120, for example.

Other than this as well, for example, the gas is generated due to heating in the mounting process of the piezoelectric device 100 on a printed circuit board. The mounting process is carried out after the piezoelectric device 100 being manufactured.

In a case where two elements 120 and 140 are arranged in one space, the total amount of the conductive joining material used in the common space increases, and the total amount of the volatilized gas increases.

In this case, both of the change of the oscillation frequency of the piezoelectric vibration element 120 and the deterioration of the thermistor element 140 become obvious.

As explained above, this embodiment overcomes these disadvantages.

Second Embodiment

Figure 4:
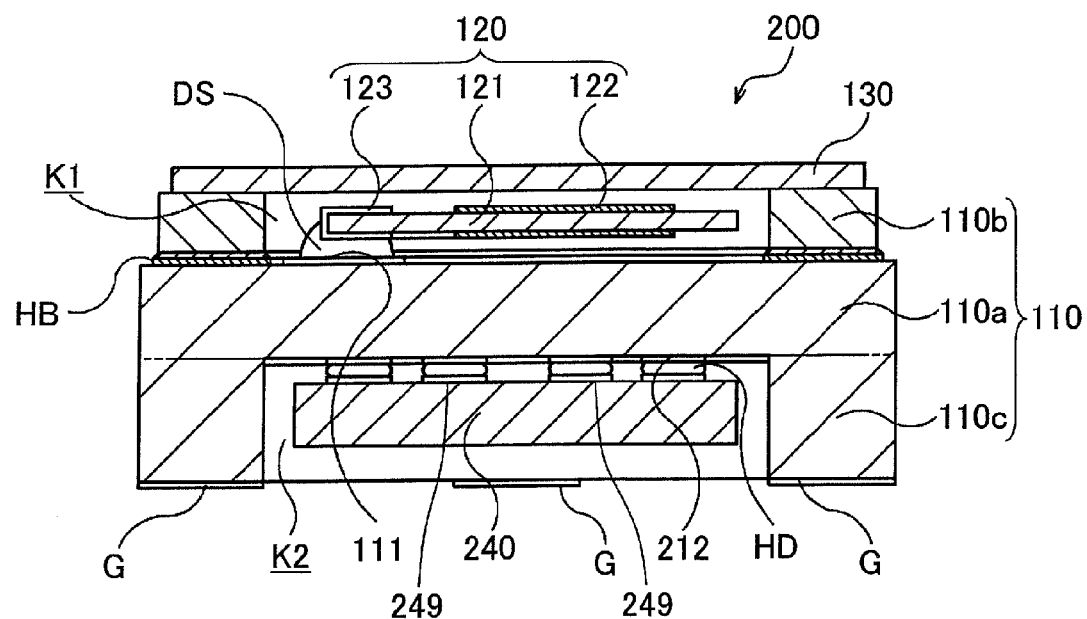
FIG. 4 is a cross-sectional view of a piezoelectric device of a second embodiment of the present invention.
Figure 5:
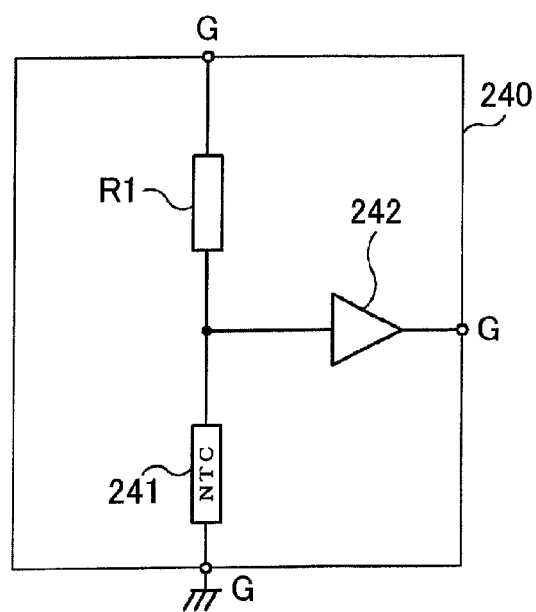
FIG. 5 is a view of an example of a circuit diagram of a temperature detecting IC (integrated circuit) device in the piezoelectric device of FIG. 4.

FIGS. 4 and 5 are views of a piezoelectric device 200 of a second embodiment of the present invention.

The piezoelectric device 200 of the second embodiment differs from the first embodiment in the point that a temperature detecting IC device 240 is arranged at the second concave portion K2.

The configuration of the piezoelectric device 200 of this embodiment is in common with or corresponds to that of the first embodiment except in the following explanation.

The piezoelectric device 200 of this embodiment has an element arrangement member 110, a piezoelectric vibration element 120, a cover 130, and a temperature detecting IC device 240.

The piezoelectric vibration element 120 is arranged in the first concave portion K1.

The first concave portion K1 is air-tightly sealed by the cover 130.

The temperature detecting IC device 240 is arranged in the second concave portion K2.

The temperature detecting IC device 240 has a pair of electrode sections 249 at the two ends of its rectangular outer shape.

A pair of electrode sections 249 is joined to the arrangement pads 212 for the temperature detection IC device by a conductive joining material HD like solder, for example.

The temperature detecting IC device 240, as shown in FIG. 5, has a thermistor element 241, an amplifier 242, and a resistance element R1. The temperature detecting IC device 240 is one type of temperature detection unit.

The thermistor element 241 includes an NTC (negative temperature coefficient) thermistor or a PTC (positive temperature coefficient) thermistor, for example.

The NTC thermistor has a negative temperature coefficient where a resistance value thereof decreases in response to the temperature rise.

The PTC thermistor has a positive temperature coefficient where a resistance value thereof increases in response to the temperature rise.

As shown in FIG. 5, one end of the thermistor element 241 is directly connected to the ground and the other end of it is connected to the ground through the resistance element R1.

The "ground" referred to here is an external connection electrode terminal G, for example.

The other end of the thermistor element 241 is further connected to the amplifier 242.

The amplifier 242 is connected at its input to the thermistor element 241 and is connected at its output to another external connection electrode terminal G.

As described above, in this embodiment, the temperature at the periphery of the piezoelectric vibration element 120 can be detected by the temperature detecting IC device 240.

The piezoelectric device 200 of this embodiment provides the same effects as those by the first embodiment.

For example, the gas generated from the conductive binder DS for joining the piezoelectric vibration element 120 is not deposited on the temperature detecting IC device 240.

As a result, in this embodiment, the deterioration of the thermistor element 241 built-in the temperature detecting IC device 240 can be prevented.

Further, the temperature detecting IC device 240 has the amplifier 242.

As a result, in this embodiment, in a case where the piezoelectric device 200 is mounted on a mother board, one type of printed circuit board, it is not necessary to separately mount the amplifier 242, for example.

In the mother board, the mounting area for the temperature detecting circuit becomes small.

Third Embodiment

Figure 6:
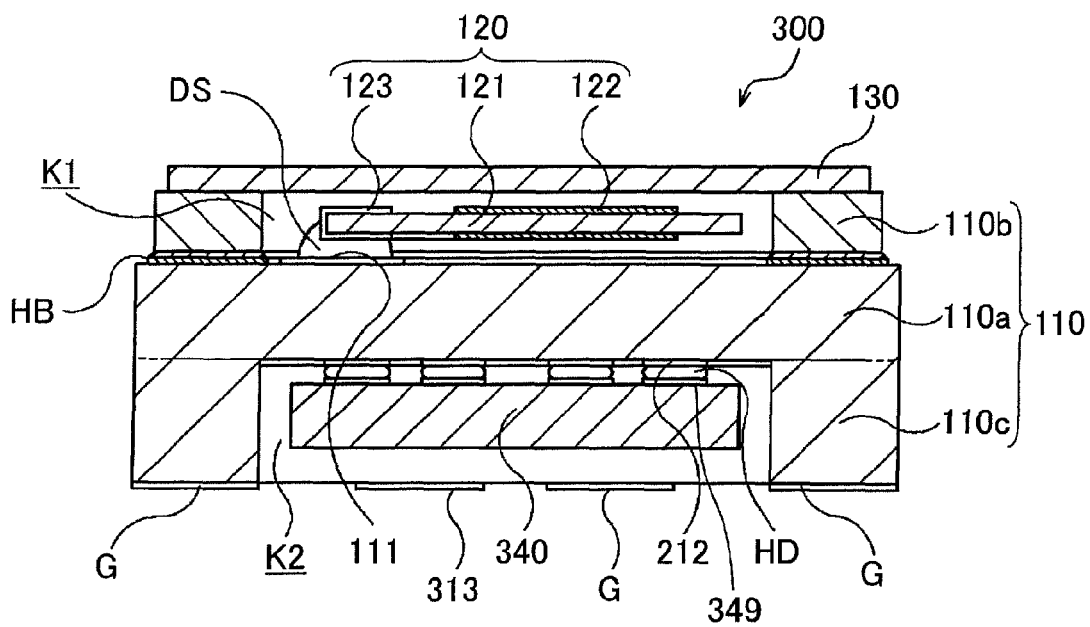
FIG. 6 is a cross-sectional view of a piezoelectric device of a third embodiment of the present invention.
Figure 7:
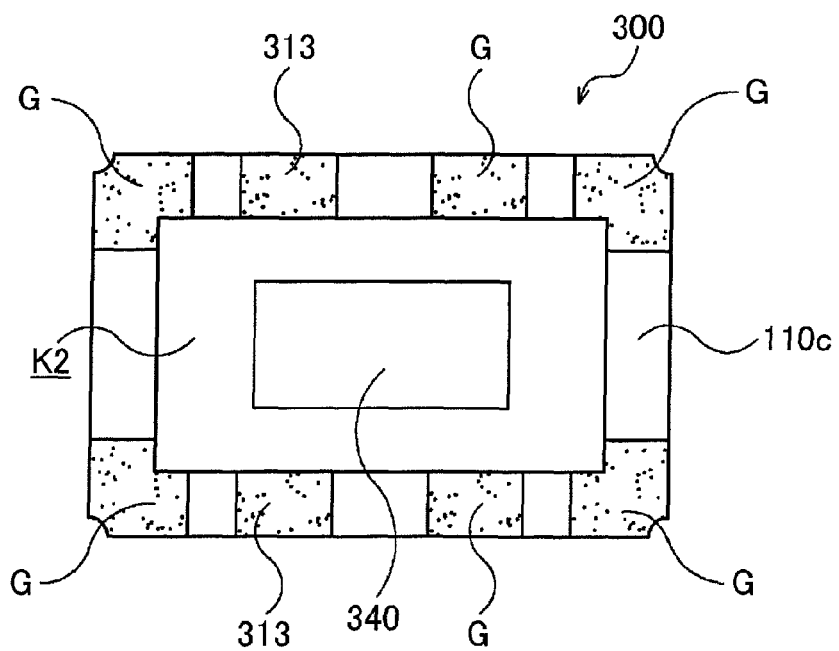
FIG. 7 is a plan view of the piezoelectric device of FIG. 6 viewing from the side of the second concave portion.
Figure 8:
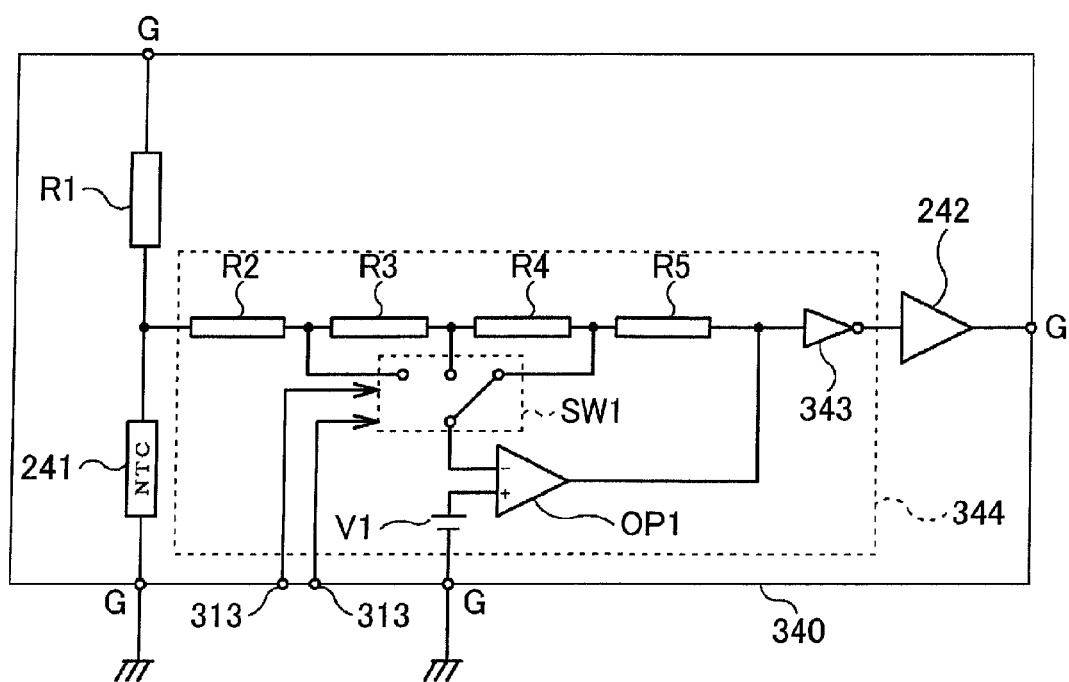
FIG. 8 is a view of an example of a circuit diagram of a temperature detecting IC device in the piezoelectric device of FIG. 6.

FIGS. 6 to 8 are views of a piezoelectric device 300 of a third embodiment of the present invention.

The piezoelectric device 300 of this embodiment differs from the second embodiment in the point that a gain control circuit 344 is built-in the temperature detecting IC device 340.

The configuration of the piezoelectric device 300 of this embodiment is in common with or corresponds to that of the second embodiment except in the following explanation.

The temperature detecting IC device 340 has a pair of electrode sections 349 at the two ends of its rectangular outer shape.

A pair of electrode sections 349 is joined to the arrangement pads 212 for the temperature detecting IC device by a conductive joining material HD like solder, for example.

The temperature detecting IC device 340, as shown in FIG. 8, has a thermistor element 241, an amplifier 242, a gain control circuit 344, and a resistance element R1. The temperature detecting IC device 340 is one type of temperature detection unit.

The gain control circuit 344 is connected between the other end of the thermistor element 241 and the input of the amplifier 242.

The amplifier 242 is connected between one of the external connection electrode terminals G and the NOT circuit 343 of the gain control circuit 344.

The gain control circuit 344 has resistance elements R2, R3, R4, and R5, an inverting amplifier OP1, a switch SW1, a voltage source V1, and a NOT circuit 343, for example.

The switch SW1 performs a switching operation by applying a predetermined voltage to the switching electrode terminal 313 (see FIG. 7) of the element arrangement member 110.

Due to this, the resistance value of the series-connected resistance elements between the thermistor element 241 and the amplifier 242 changes.

As the resistance value changes, the gradient of the characteristic line indicating the relationship between the voltage and temperature of the thermistor element 241 changes.

As a result, the range and extent of the output voltage can be changed in accordance with the type of the main IC of the electronic apparatus.

The inverting amplifier OP1 is connected at its plus (positive polarity) input to the voltage source V1 and is connected at its minus (negative polarity) input to the switch SW1.

The output of the inverting amplifier OP1 is connected to the NOT circuit 343.

The NOT circuit 343 is connected between the output of the inverting amplifier OP1 and the input of the amplifier 242.

As shown in FIG. 7, a switching electrode terminal 313 is formed between several external connection electrode terminals G of the frame 110c.

As described above, in this embodiment, by the temperature detecting IC device 340, the temperature of the periphery of the piezoelectric vibration element 120 can be detected.

In this embodiment, the same effects as those by the second embodiment are obtained.

In this embodiment, the gain control circuit 344 and amplifier 242 are built-in the temperature detecting IC device 340.

As a result, in this embodiment, in a state where the piezoelectric device 300 is arranged on the mother board of a communication apparatus, it is not necessary to provide the gain control circuit 344 and the amplifier 242 on the mother board, for example.

The mounting area for the temperature detecting circuit is small in the mother board.

In this embodiment, due to the gain control circuit 344 of the temperature detecting IC device 340, the gradient of the characteristic line indicating the relationship between the voltage and temperature of the thermistor element 241 is switchable.

In this embodiment, even in a case where the manufactured temperature detecting IC devices 340 have individual differences, the individual differences can be reduced.

In this embodiment, the temperature detecting IC device 340 manufactured with an individually different character can be used for the piezoelectric device 300.

Fourth Embodiment

FIGS. 9 to 13A and 13B are views of a piezoelectric device 400 of a fourth embodiment of the present invention.

The piezoelectric device 400 of this embodiment differs from the first embodiment in the points that the substrate portion 110*a* has an inner layer and that both of a pair of two electrode terminals G1 for the piezoelectric vibration element and a pair of two electrode terminals G2 for the thermistor element are given a predetermined arrangement.

The configuration of the piezoelectric device 400 of this embodiment is in common with or corresponds to that of the first embodiment except in the following explanation.

Four external connection electrode terminals G are formed at four corners of the back surface of the second frame portion 110*c*.

The external connection electrode terminals G at the two corner portions which are adjacent to each other in a short side direction of the second frame portion 110*c* are utilized as a pair of two electrode terminals G1 for the piezoelectric vibration element.

The remaining external connection electrode terminals G at the other two corner portions which are adjacent to each other in the other short side direction of the second frame portion 110*c*, are utilized as a pair of two electrode terminals G2 for the thermistor element.

In this case, each set of terminals G1 and terminals G2 is arranged adjacently. Each set of the terminals G1 and terminals G2 is not arranged diagonally.

Figure 12A:
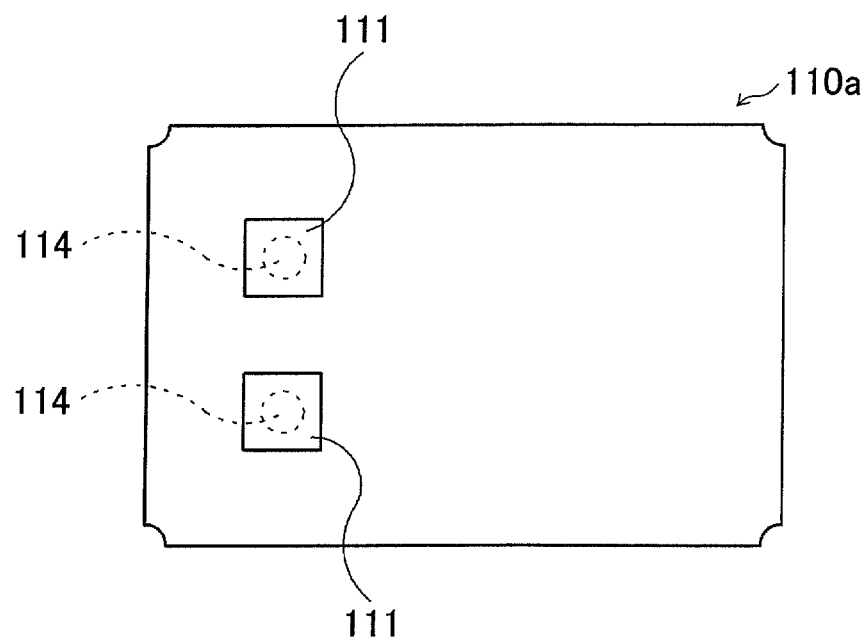
FIG. 12A is a plan view of one major surface of the substrate portion of FIG. 9 viewing from the side of the piezoelectric vibration element.
Figure 12B:
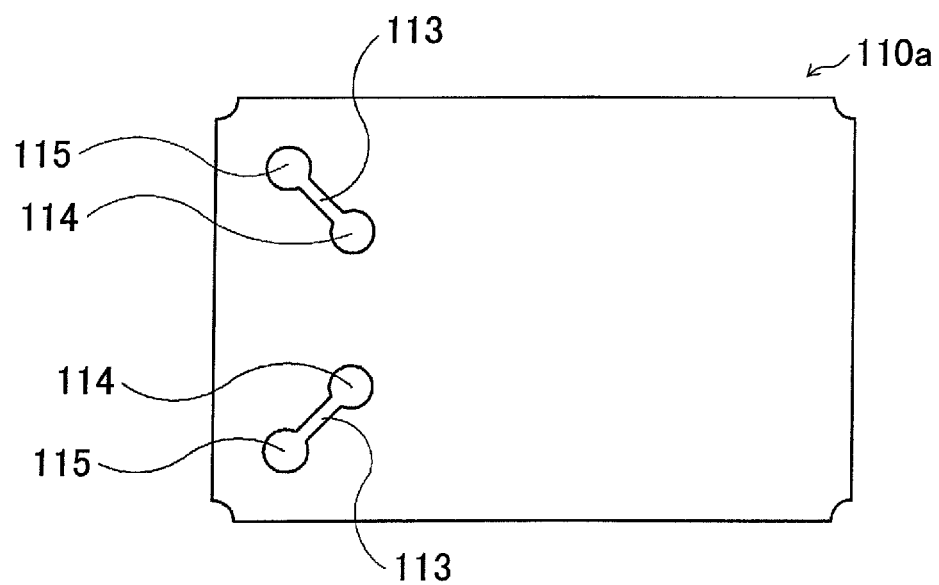
FIG. 12B is a plan view of one major surface of an inner layer of the substrate portion of FIG. 9 viewing from the side of the thermistor element.
Figure 13A:
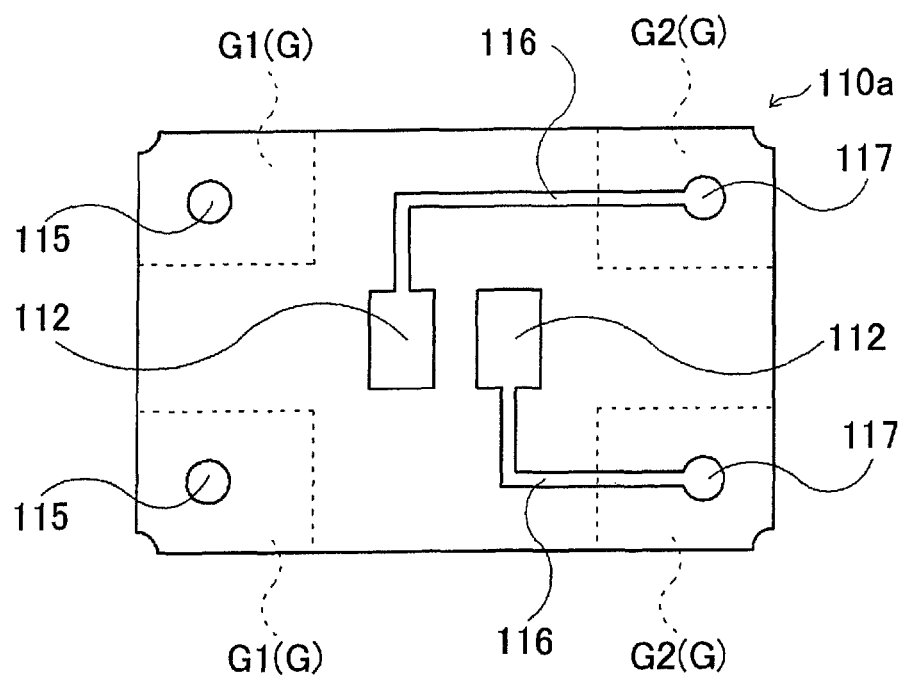
FIG. 13A is a plan view of the substrate portion of FIG. 9 viewing from the side of the other major surface.
Figure 13B:
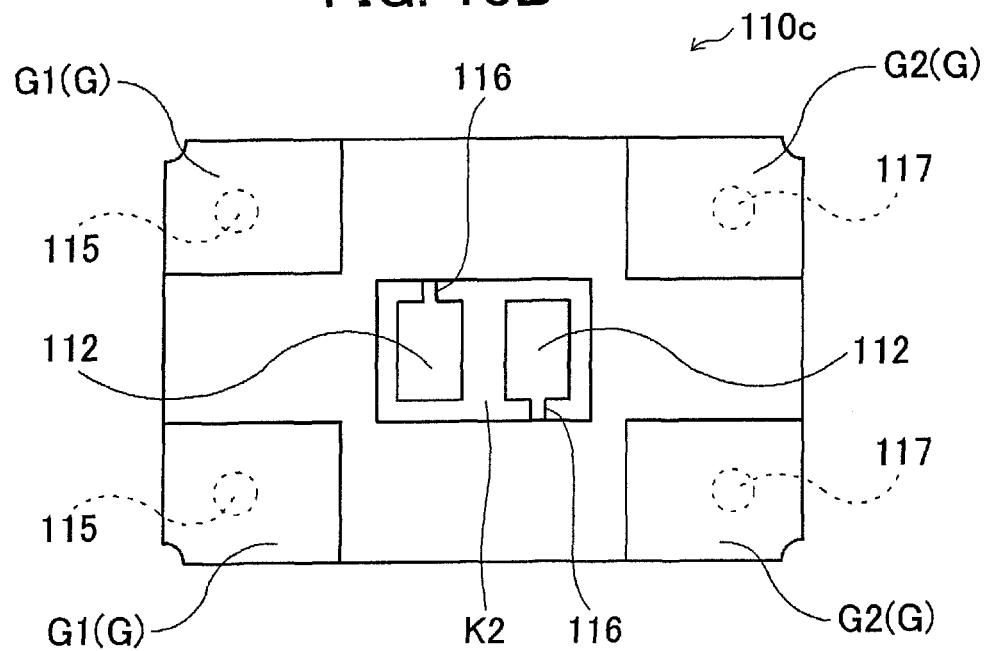
FIG. 13B is a plan view of the element arrangement member of FIG. 9 viewing from the side of the other major surface.

As shown in FIGS. 12A and 12B, the arrangement pads 111 for the piezoelectric vibration element are connected through first via-conductors 114 to the first ends of the interconnect patterns 113 for the piezoelectric vibration element.

The other ends of the interconnect patterns 113 for the piezoelectric vibration element are connected through second via-conductors 115 to the electrode terminals G1 for the piezoelectric vibration element.

Due to this, the arrangement pads 111 and the electrode terminals G1 for the piezoelectric vibration element are electrically connected.

The arrangement pads 112 for the thermistor element are connected to first ends of the interconnect patterns 116 for the thermistor element.

The other ends of the interconnect patterns 116 for the thermistor element are connected through third via-conductors 117 to the electrode terminals G2 for the thermistor element.

Due to this, the arrangement pads 112 and the electrode terminals G2 for the thermistor element are electrically connected.

As described above, in this embodiment, the electrode terminals G1 for the piezoelectric vibration element are arranged at two corner portions which are adjacent to each other in the short side direction of the second frame portion 110*c*.

The electrode terminals G2 for the thermistor element are arranged at the remaining other two corner portions which are adjacent to each other in the short side direction of the second frame portion 110*c*.

In this embodiment, by using the interconnect patterns 113 formed in the inner layer of the substrate portion 110*a*, the arrangement pads 111 and the electrode terminals G1 for the piezoelectric vibration element are electrically connected.

Accordingly, in this embodiment, as shown in FIGS. 12A to 13B, in the substrate portion 110*a*, it is possible to prevent the generation of intersecting or approaching of the interconnect patterns 116 for the thermistor element and the interconnect patterns 113 for the piezoelectric vibration element.

As a result, in this embodiment, the floating capacitor of the interconnect patterns 113 and 116 can be reduced.

The output voltage of the thermistor element 140 is no longer influenced by the floating capacitor of the interconnect patterns 113 and 116 in the substrate portion 110*a*. Thus, the output value becomes correct.

In this embodiment, the correct value can be output from the thermistor element 140.

The temperature difference between the detection temperature converted from the output voltage of the thermistor element 140 and the actual temperature of the periphery of the piezoelectric vibration element 120 is reduced.

Modification of Fourth Embodiment

In the fourth embodiment, the arrangement pads 112 for the thermistor element are arranged in parallel to the long side direction of the element arrangement member 110.

Figure 14A:
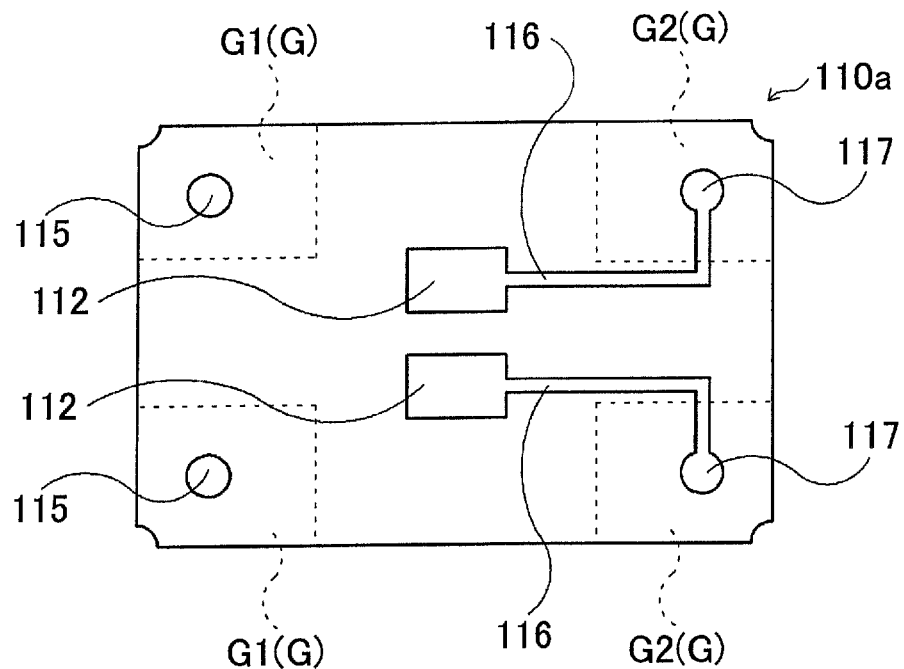
FIG. 14A is a plan view of the substrate portion of the piezoelectric device of a modification of the fourth embodiment viewing from the side of the other major surface.
Figure 14B:
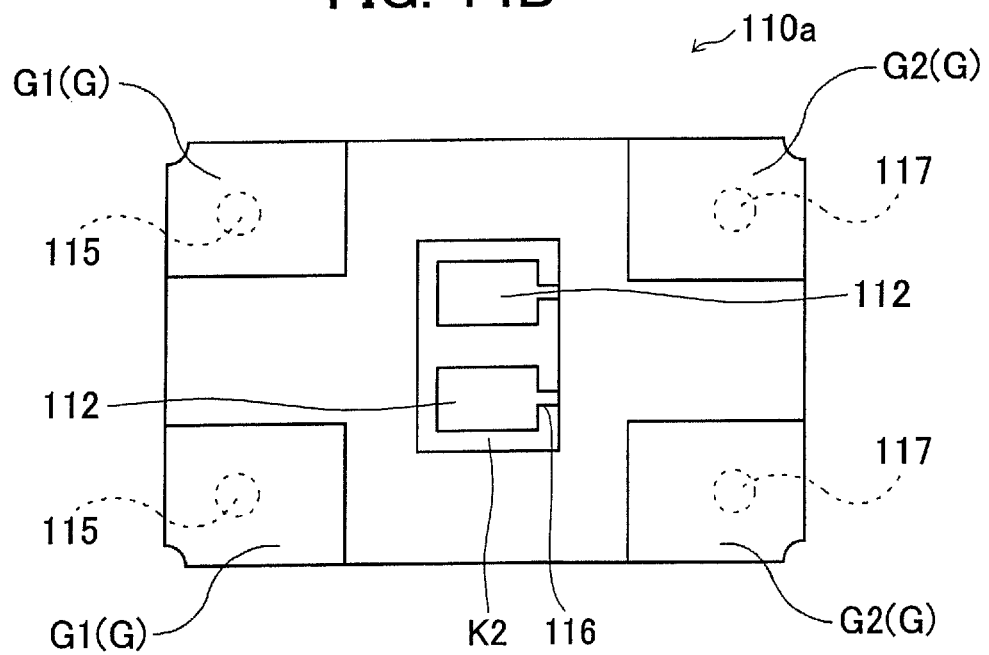
FIG. 14B is a plan view of the element arrangement member of the modification viewing from the side of the other major surface.

Other than this, for example, the arrangement pads 112 for the thermistor element 140 may be arranged in parallel to the short side direction of the element arrangement member 110 as shown in FIGS. 14A and 14B.

In a case where the arrangement pads 112 for the thermistor element are arranged in parallel to the short side direction of the element arrangement member 110, the lengths of the interconnect patterns 116 from these pads 112 to the electrode terminals G2 become short and equal.

As a result, in this modification, the capacitance of the floating capacitor of the interconnect patterns 116 can be made further smaller.

The output value of the thermistor element 140 becomes more correct.

As opposed to this, in the piezoelectric device, if arranging the sets of the electrode terminals G1 and G2 diagonally, the following disadvantages may occur.

First, in a case where the sets of terminals are arranged diagonally, in the element arrangement member 110, the interconnect patterns 116 for the thermistor element and the interconnect patterns 113 for the piezoelectric vibration element intersect.

As a result, a floating capacitor is generated between these interconnect patterns 113 and 116, and the capacitance of the floating capacitor of the interconnect patterns 113 and 116 increase.

Second, in a case where the sets of terminals are arranged diagonally, the interconnect patterns 113 which are connected to the arrangement pads 111 for the piezoelectric vibration element and the interconnect patterns 116 which are connected to the arrangement pads 112 for the thermistor element become close and in parallel in the element arrangement member 110.

As a result, the capacitance of the floating capacitor of the interconnect patterns 113 and 116 further increase.

Due to the increase of the floating capacitor of these interconnect patterns 113 and 116, the output voltage of the thermistor element 140 changes.

In a case where the output value of the thermistor element 140 changes due to the floating capacitor, the temperature difference between the detection temperature detected by converting the output voltage of the thermistor element 140 and the actual temperature becomes large.

As explained above, this embodiment overcomes the above disadvantages.

Fifth Embodiment

FIGS. 15 to 18A and 18B are views of a piezoelectric device 500 of a fifth embodiment of the present invention.

Figure 9:
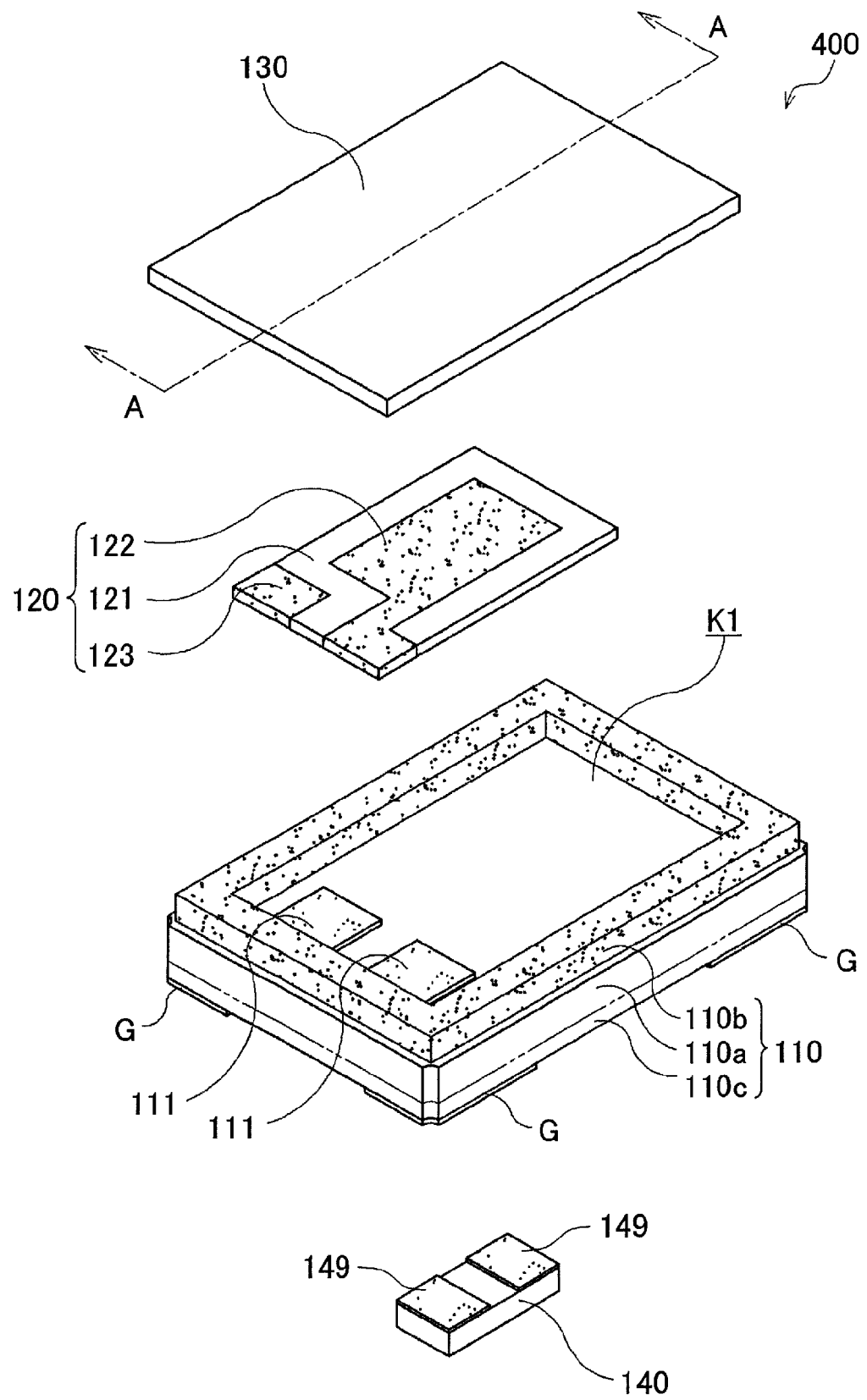
FIG. 9 is a disassembled perspective view of a piezoelectric device of a fourth embodiment of the present invention.
Figure 10:
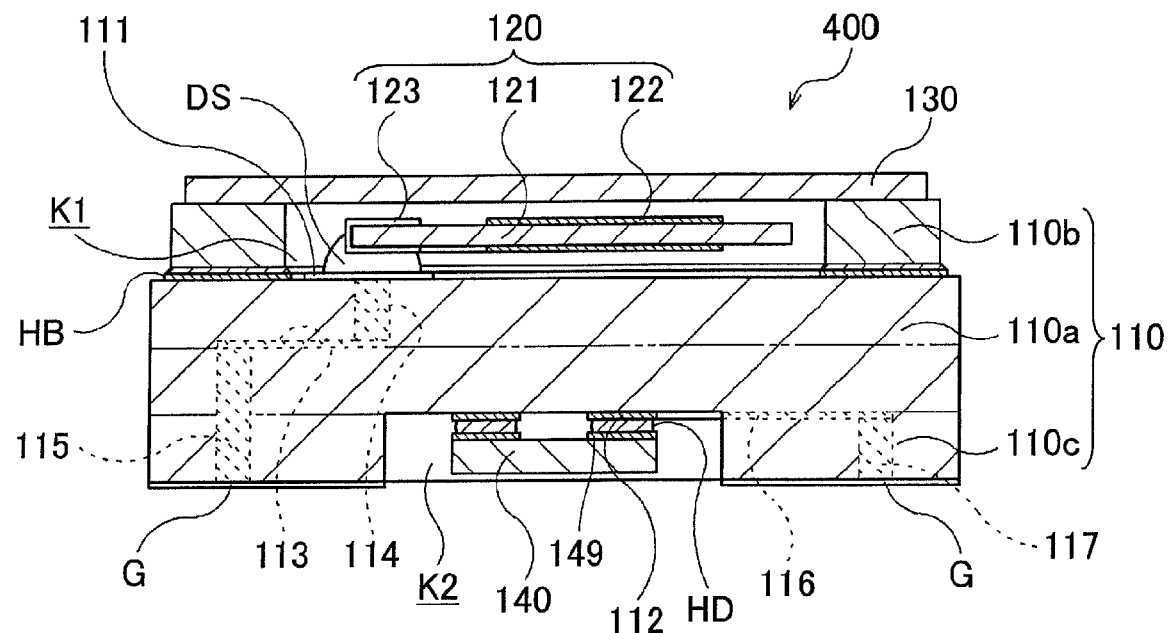
FIG. 10 is a cross-sectional view of the piezoelectric device along with A-A in FIG. 9.
Figure 11:
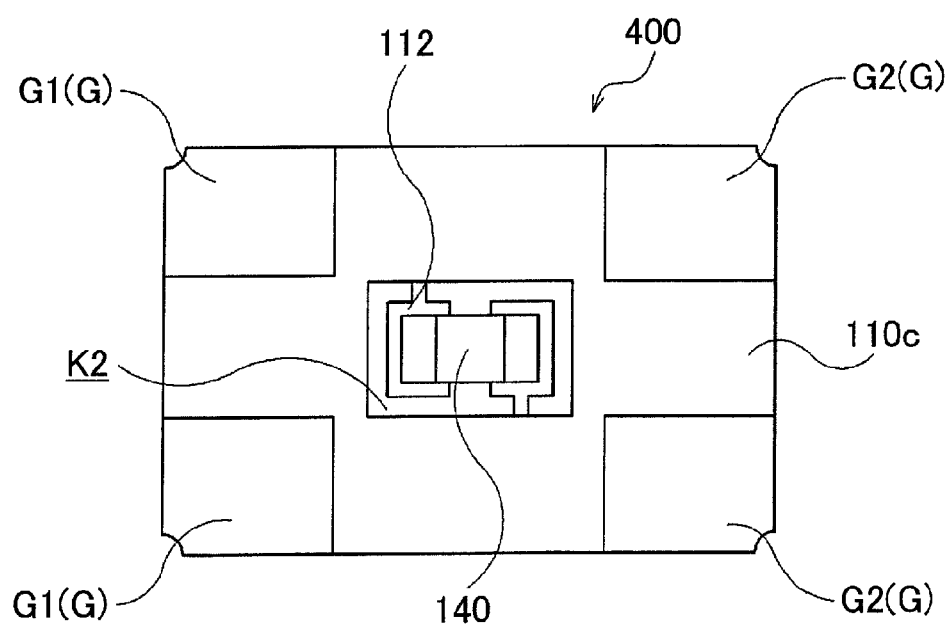
FIG. 11 is a plan view of the piezoelectric device of FIG. 9 viewing from the side of the thermistor element.

FIG. 9 of the fourth embodiment is referred as a disassembled perspective view of the piezoelectric device 500 of the fifth embodiment. FIG. 10 is referred as a cross-sectional view of it.

The piezoelectric device 500 of this embodiment differs from the fourth embodiment in the point that the thermistor element 140 is arranged in a position overlapping to the excitation electrode section 122 of the element arrangement member 110.

The configuration of the piezoelectric device 500 of this embodiment is in common with or corresponds to that of the first embodiment except in the following explanation.

Figure 15:
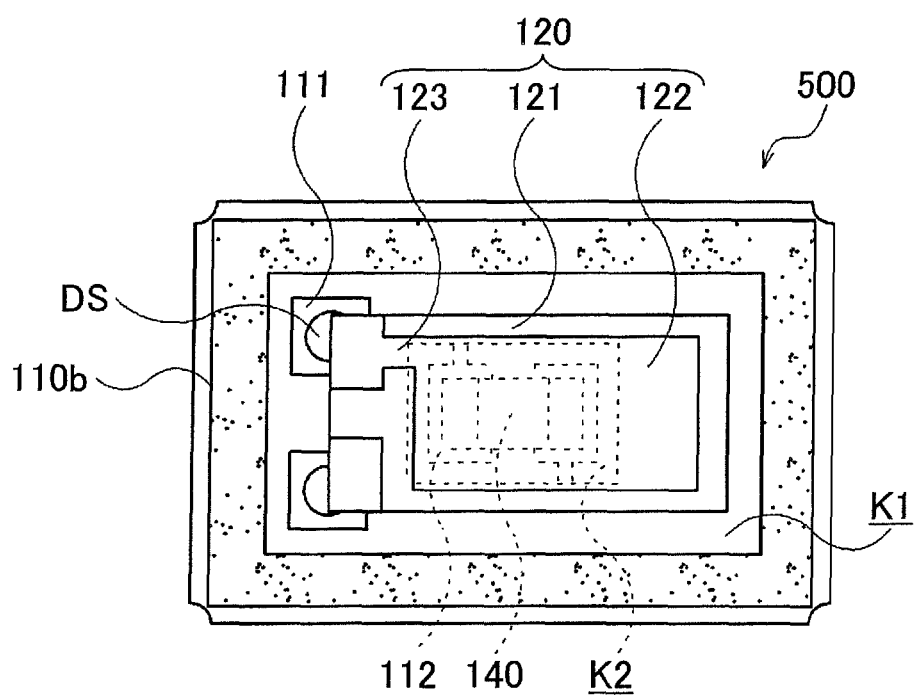
FIG. 15 is a plan view of the element arrangement member of a piezoelectric device of a fifth embodiment of the present invention viewing from the side of the piezoelectric vibration element.

As shown in FIG. 15, the thermistor element 140 is arranged in a position overlapping to the excitation electrode section 122 of the piezoelectric vibration element 120 in a perspective plane view.

In FIG. 15, the second concave portion K2 overlaps the piezoelectric vibration element 120 in a perspective plane view, that is, is formed in the position just under the piezoelectric vibration element 120.

The outer circumference of the thermistor element 140 does not protrude from the outer circumference of the position under the excitation electrode section 122.

In a case where the thermistor element 140 is arranged in this way, noise of the thermistor element 140 is reduced.

The correct output value can be detected from the output of the thermistor element 140.

Figure 16:
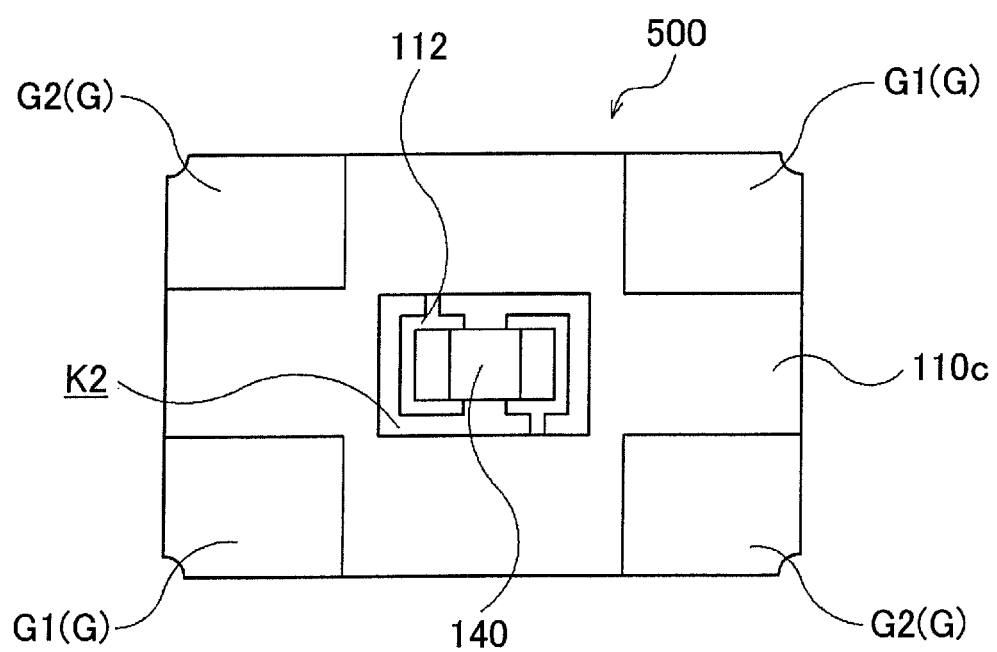
FIG. 16 is a plan view of the piezoelectric device of FIG. 15 viewing from the side of the thermistor element.

As shown in FIG. 16, two electrode terminals G1 for the piezoelectric vibration element are arranged diagonally at the second frame portion 110c.

Two electrode terminals G2 for the thermistor element are arranged at the other diagonal positions of the second frame portion 110c.

Note that, the sets of terminals may be arranged in adjoining position as in the fourth embodiment.

Figure 17A:
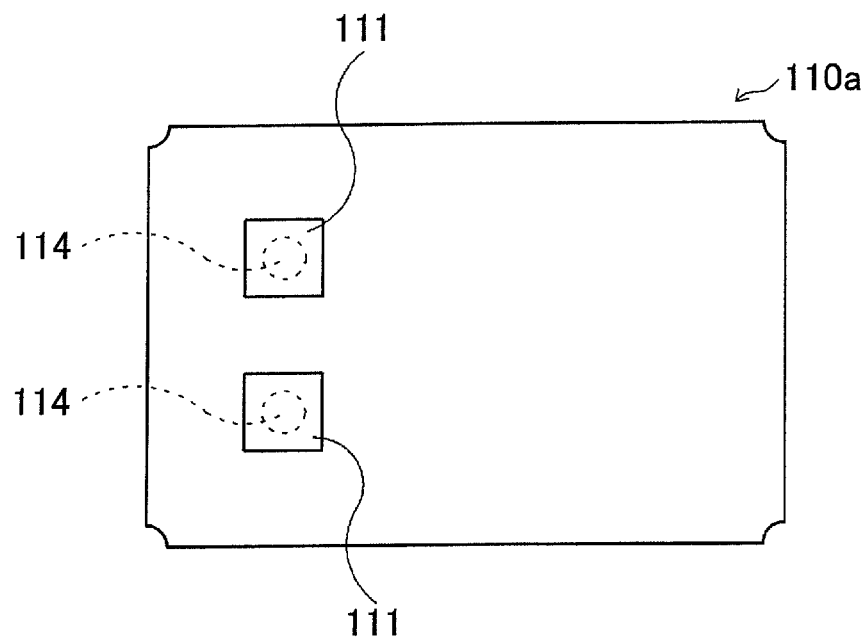
FIG. 17A is a plan view of the substrate portion of the piezoelectric device of FIG. 15 viewing from the side of one major surface.
Figure 17B:
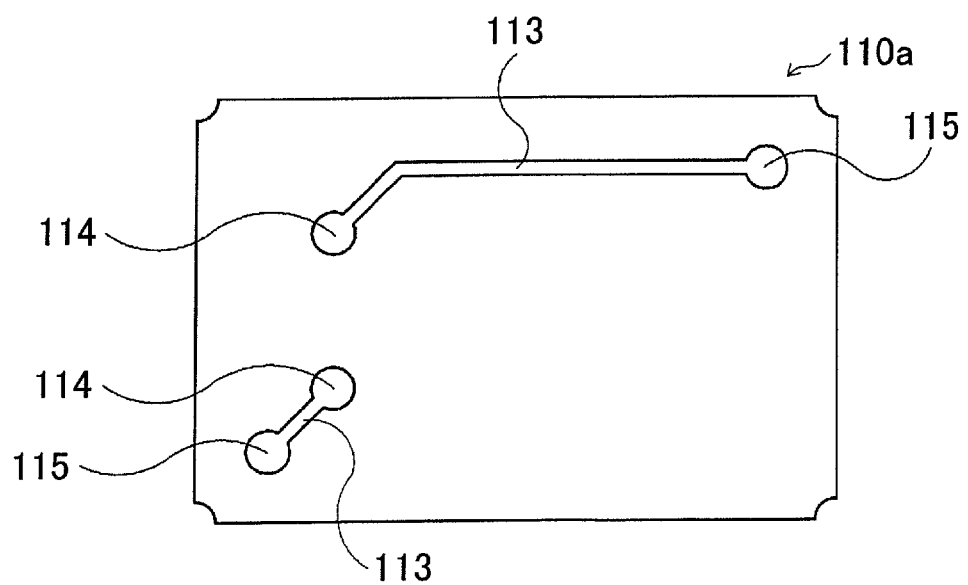
FIG. 17B is a plan view of the inner layer of the substrate portion of the piezoelectric device of FIG. 15 viewing from the side of one major surface.

As shown in FIGS. 17A and 17B and FIG. 10, the arrangement pads 111 for the piezoelectric vibration element and the external connection electrode terminals G are connected by the first via-conductors 114 of the substrate portion 110a, the interconnect patterns 113 formed in the inner layer of the substrate portion 110a, and the second via-conductors 115 formed in the substrate portion 110a and second frame portion 110c.

As shown in FIGS. 15 and 16, the arrangement pads 111 for the piezoelectric vibration element are connected through the first via-conductors 114 to first ends of the interconnect patterns 113 for the piezoelectric vibration element.

The other ends of the interconnect patterns 113 are connected through the second via-conductors 115 to the electrode terminals G1 for the piezoelectric vibration element.

Figure 18A:
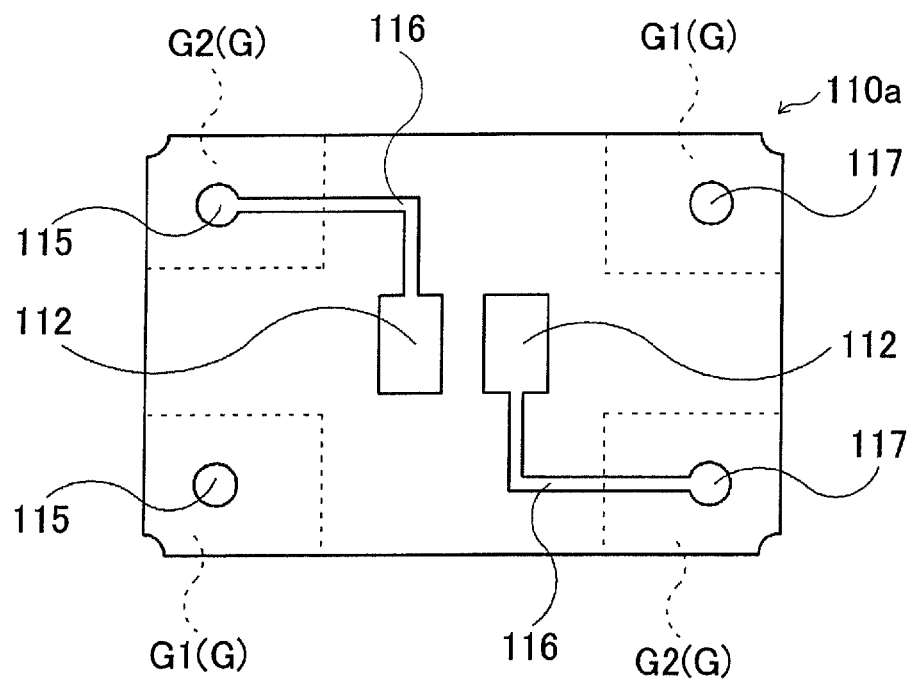
FIG. 18A is a plan view of the substrate portion of the piezoelectric device of FIG. 15 viewing from the side of the other major surface.
Figure 18B:
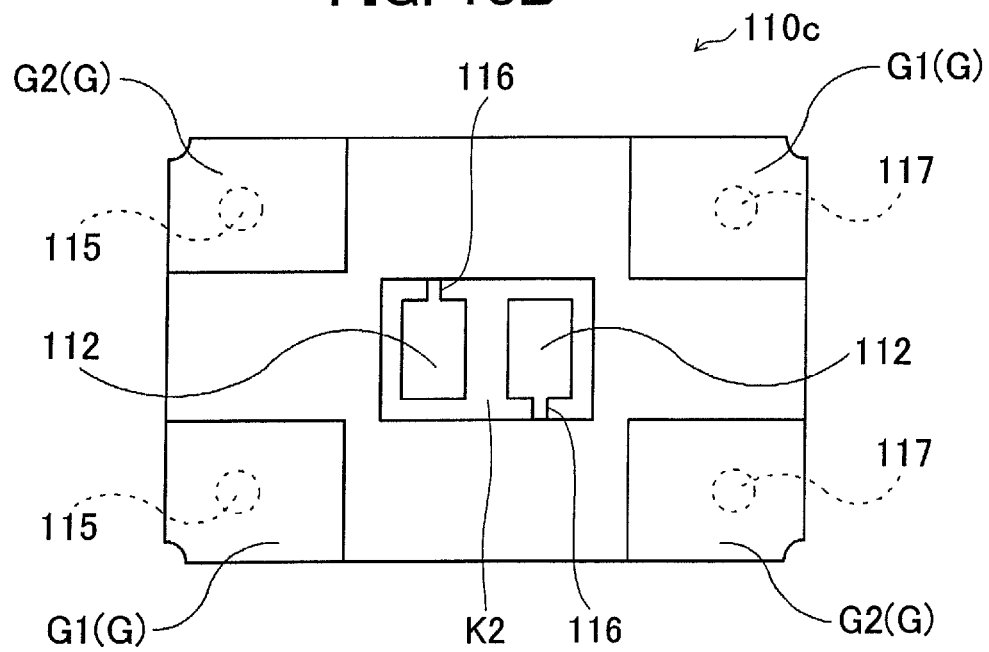
FIG. 18B is a plan view of the element arrangement member of the piezoelectric device of FIG. 15 viewing from the side of the other major surface.
Figure 19:
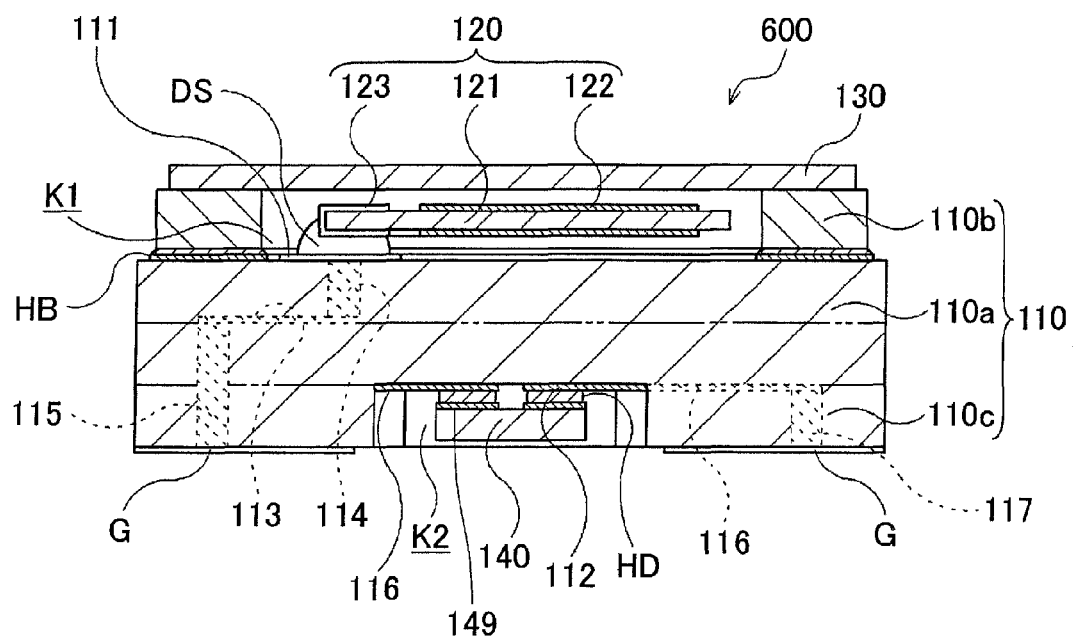
FIG. 19 is a cross-sectional view of a piezoelectric device of a sixth embodiment of the present invention corresponding to A-A of FIG. 9.

As shown in FIGS. 18A and 18B and FIG. 10, the arrangement pads 112 and the electrode terminals G2 are connected by the interconnect patterns 116 formed in the substrate portion 110a and the third via-conductors 117 formed in the second frame portion 110c.

As shown in FIGS. 18A and 18B, the arrangement pads 112 are connected to first ends of the interconnect patterns 116 for the thermistor element.

The other ends of the interconnect patterns 116 are connected through the third via-conductors 117 to the electrode terminals G2 for the thermistor element.

The conductive joining material HD is formed by at least one type material selected from among Sn (tin), Ag (silver), and Cu (copper), for example.

The conductive joining material HD contains flux for example, is in a paste state, and becomes hard by causing the flux to volatilize by heating.

In a case where the conductive joining material HD becomes hard, the thermistor element 140 and the arrangement pads 112 for the thermistor element are joined.

As described above, the thermistor element 140 arranged at the second concave portion K2 in this embodiment is arranged in a region overlapping to the excitation electrode section 122 so as not to protrude from the outer circumference of the region.

The excitation electrode section 122 is made of metal.

The thermistor element 140 is shielded by the excitation electrode section 122.

As a result, the thermistor element is doubly shielded by two members of the cover 130 and excitation electrode section 122.

Superposition of noise on the thermistor element 140 becomes hard to occur.

The value of the thermistor element 140 becomes correct. The temperature difference is reduced.

As opposed to this, if the thermistor element 140 is arranged in a region come near to one side of the element arrangement member 110, the superposition of noise on the thermistor element 140 occurs easily.

In a case where the noise is superimposed, the value of the thermistor element becomes incorrect.

As a result, the temperature difference between the detection temperature obtained by converting the output voltage of the thermistor element, and the actual temperature of the periphery of the piezoelectric vibration element 120, becomes large.

As explained above, this embodiment overcomes this disadvantage.

Sixth Embodiment

FIGS. 19 to 21A and 21B are views of a piezoelectric device 600 of a sixth embodiment of the present invention.

FIG. 9 for the fourth embodiment is referred for a disassembled perspective view of the piezoelectric device 600 of the sixth embodiment.

FIGS. 17A and 17B for the fifth embodiment is referred for the interconnect patterns 113 for the piezoelectric vibration element formed in the inner layer of the substrate portion 110a.

The piezoelectric device 600 of this embodiment differs from the fifth embodiment in the point that a third concave portion K3 is formed as to surround the second concave portion K2.

The configuration of the piezoelectric device 600 of this embodiment is in common with or corresponds to that of the fifth embodiment except in the following explanation.

Figure 20A:
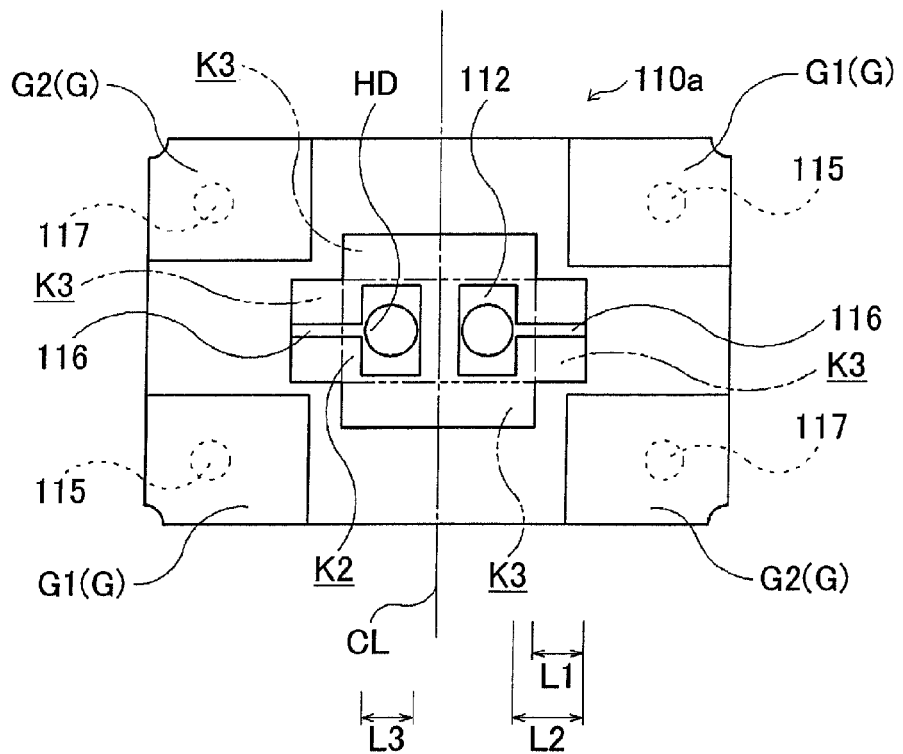
FIG. 20A is a plan view of the element arrangement member of the piezoelectric device of FIG. 19 viewing from the side of the thermistor element.
Figure 20B:
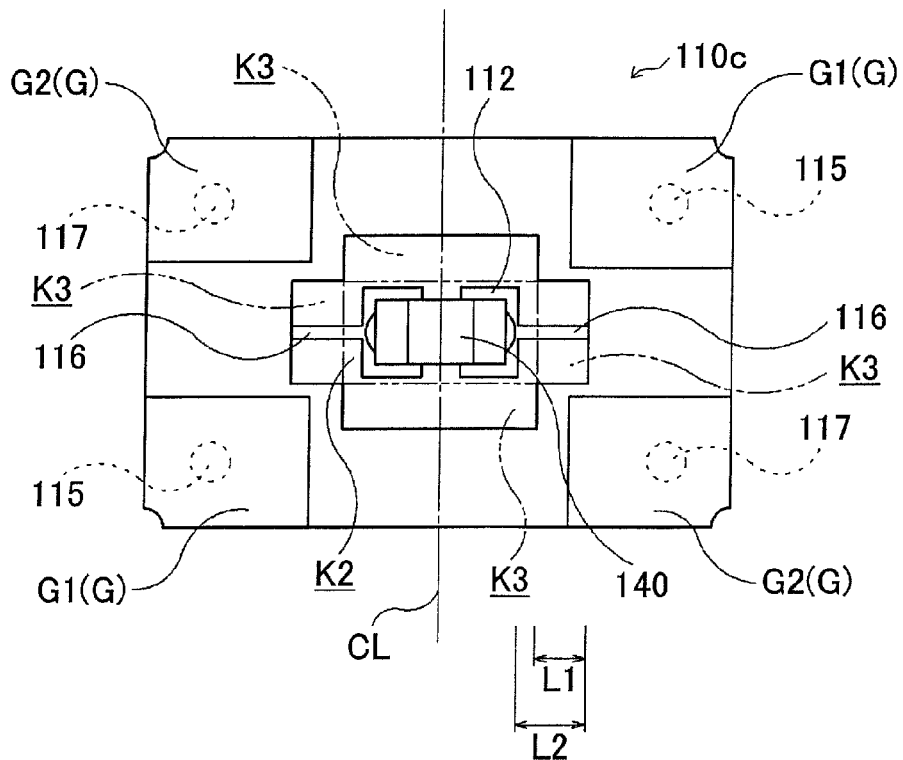
FIG. 20B is a plan view of the piezoelectric device of FIG. 19 viewing from the side of the thermistor element.

The thermistor element 140 is arranged at the second concave portion K2 as shown in FIGS. 20A and 20B.

In FIGS. 20A and 20B, the long side direction of the thermistor element 140 and the long side direction of the second concave portion K2 are substantially parallel.

The third concave portion K3 is formed at the periphery of the second frame portion 110c.

Specifically, the third concave portion K3 is formed between each of two adjacent external connection electrode terminals G.

The third concave portion K3 is connected with the second concave portion K2 as to form one space together with the second concave portion K2.

A portion of the interconnect patterns 116 for the thermistor element is exposed at the second concave portion K2 and third concave portion K3.

The length L1 of the third concave portion K3 is between 100 to 200 micrometers, for example.

The third concave portion K3 sets the side surface of the space in which the thermistor element 140 is arranged further away from the center of the space than the case in which the space is formed only by the second concave portion K2.

An interval between the side surface of the space in which the thermistor element 140 is arranged and the arrangement pad 112 for the thermistor element on which the conductive joining material HD is coated, is secured.

As shown in FIGS. 20A and 20B, both of two interconnect patterns 116 for the thermistor element are exposed in the second concave portion K2 and the third concave portion K3. Both of two interconnect patterns 116 for the thermistor element are formed in parallel to each other in a common direction along with the long side of the element arrangement member 110.

Both of two interconnect patterns 116 for the thermistor element are arranged in a line symmetrical position with respect to the center line CL of the second concave portion K2 in the short side direction.

A pair of two interconnect patterns 116 for the thermistor element are extended parallel along with the alignment direction of the arrangement pads 112 which are joined with the thermistor element 140.

Figure 21A:
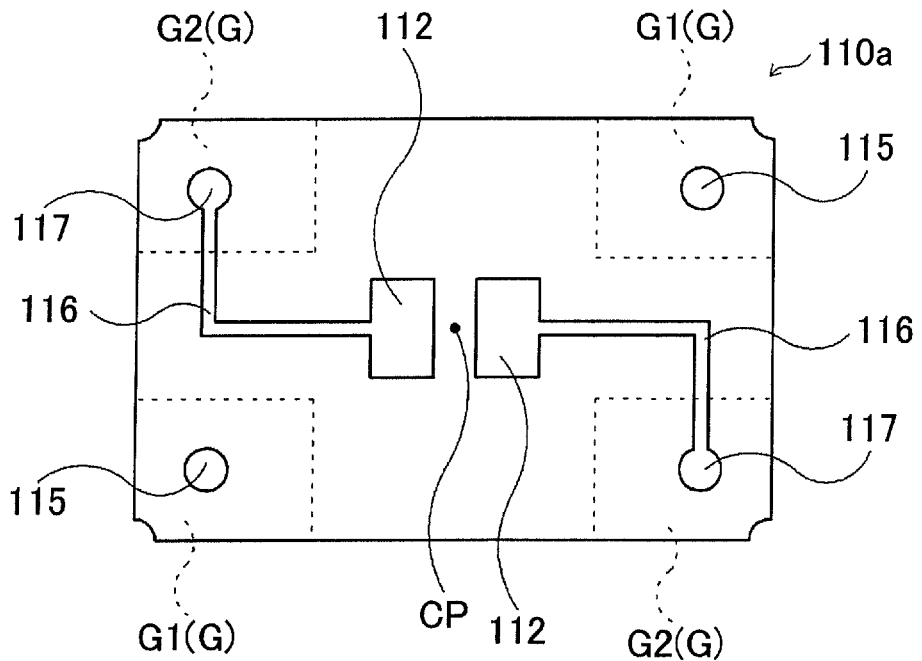
FIG. 21A is a plan view of the substrate portion of the piezoelectric device of FIG. 19 viewing from the side of the other major surface.
Figure 21B:
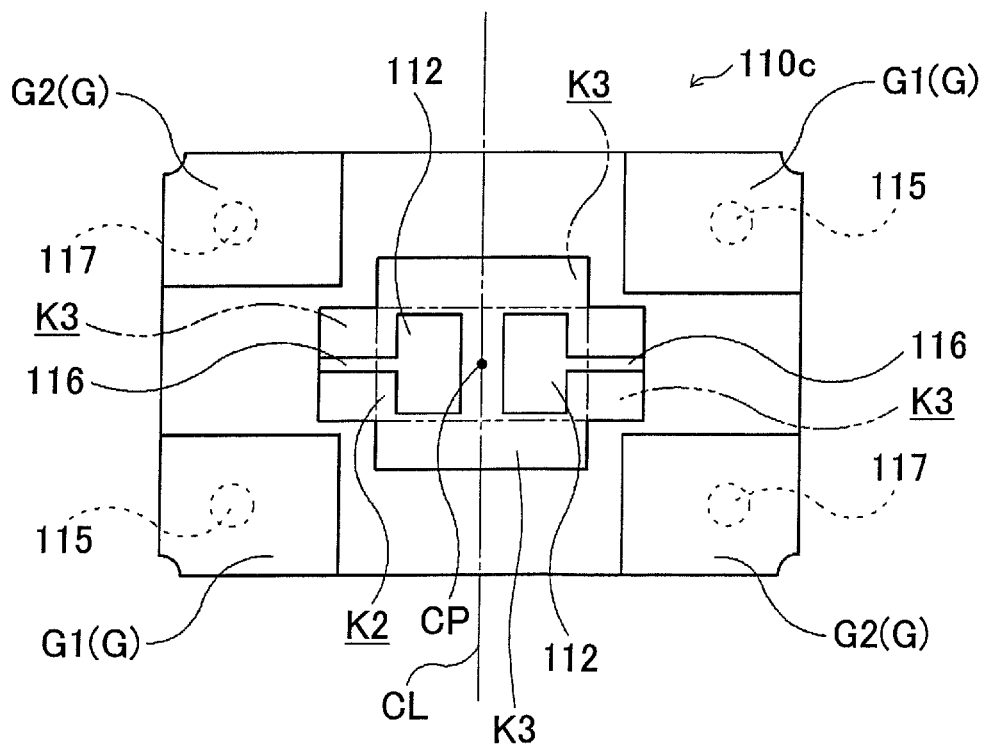
FIG. 21B is a plan view of the element arrangement member of the piezoelectric device of FIG. 19 viewing from the side of the other major surface.

The center line CL passes through the center point CP of the second concave portion K2 of the element arrangement member 110 as shown in FIGS. 21A and 21B.

The center line CL is parallel to the short side direction of the element arrangement member 110.

In this case, the lengths L2 of the exposed portions of both of two interconnect patterns 116 are equal to each other.

The lengths L2 are 200 to 250 micrometers, for example.

A diameter L3 of the conductive joining material HD being coated and the length L2 of the interconnect patterns 116 for the thermistor element are in the relationship of the following equation 1.

$$0.65 \leq L3/L2 \leq 0.85 \qquad \text{Equation 1}$$

In a case where the value of L3/L2 is smaller than 0.65, the conductive joining material HD coated on the arrangement pads 112 flow out to the interconnect patterns 116.

In this case, a first end of the thermistor element 140 is detached from the arrangement pad 112, and the thermistor element 140 becomes a standing state wherein it is joined only at its other end.

In a case where the value of L3/L2 is larger than 0.85, the conductive joining material HD coated on the arrangement pads 112 overflows from the pads 112.

In this case, by the conductive joining material HD, the two arrangement pads 112 are in a short-circuited state, for example.

In a case where the relationship between the diameter L3 of the coated conductive joining material HD and the length L2 of the interconnect patterns 116 satisfy the above equation 1, the thermistor element 140 becomes hard to be detached from the arrangement pads 112, and the arrangement pads 112 become hard to be in a short-circuit state.

The conductive joining material HD is made of a silver paste or lead-free solder, for example.

The conductive joining material HD may contain an additional solvent to be adjusted to a viscosity for easy coating.

The element arrangement member 110 is made of an alumina ceramic, for example.

In this case, the element arrangement member 110 can be shaped by the following method, for example.

First, an additive such as an organic solvent is added to and mixed with a predetermined ceramic material powder to form a ceramic green sheet.

Next, the surface of the ceramic green sheet is coated by screen printing with a conductor paste to be formed as the arrangement pads 111 for the piezoelectric vibration element, arrangement pads 112 for the thermistor element, a film-shaped conductive sealing pattern HB and an external connection electrode terminals G.

Further, the ceramic green sheet is punched, then a conductor paste is coated by screen printing over the perforated through holes to be formed as a first via-conductors 114, a second via-conductors 115, and a third via-conductors 117.

Next, a predetermined number of ceramic green sheets are stacked, press-formed, and burned at a high temperature.

As described above, in the piezoelectric device 600 of this embodiment, the third concave portion K3 is formed at the periphery of the second concave portion K2.

In a step for coating the conductive joining material HD from a nozzle, the conductive joining material HD becomes hard to deposit on portions other than the arrangement pads 112 for the thermistor element.

Further, a required sufficient length can be secured as the interconnect patterns 116 for the thermistor element.

The short-circuit state caused by the protrusion of the conductive joining material HD is reduced.

The two interconnect patterns 116 for the thermistor element are formed in the third concave portion K3 to be parallel to the long side direction of the element arrangement member 110 and to be symmetric with respect to the center line CL of the second concave portion K2.

The coating diameter L3 of the conductive joining material HD and the length L2 of the interconnect patterns 116 for the thermistor element satisfy the relationship of Equation 1 explained above.

For this reason, when the thermistor element 140 to be fixed, joint portions at two ends of the thermistor element 140 are stretched in both directions of the extension directions of interconnect patterns 116 by substantially the same force.

The thermistor element 140 becomes hard to detach from the arrangement pads 112.

The thermistor pads 112 become hard to be in a short-circuit state.

In this embodiment, the two interconnect patterns 116 for the thermistor element are formed line symmetrically and have equal lengths L2 of the exposed portions.

The conductive joining material HD flows out to the interconnect patterns 116 schematically equally.

The thermistor element 140 is stretched in both of the extension directions of the interconnect patterns 116 by substantially the same force.

The thermistor element 140 becomes hard to detach from the arrangement pads 112.

As opposed to this, if the third concave portion K3 is not formed at the periphery of the second concave portion K2, the following disadvantages may arise, for example.

Namely, in a case where the conductive joining material HD is coated from a nozzle of a coater, the conductive joining material HD is deposited onto portions other than the arrangement pads 112 for the thermistor element.

In this case, the conductive joining material HD causes the arrangement pads 112 to be in an electrically short-circuited state.

Further, if a pair of two interconnect patterns 116 are disposed line symmetrically with respect to the center line CL of the second concave portion K2 (see FIGS. 20A to 21B), the thermistor element 140 is stretched in one side by the flowing conductive joining material HD at the process to fixing the thermistor element 140.

The thermistor element 140 stretched in one side and is detached from the arrangement pads 112.

In portionicular, in a case where the lengths of the exposed portions of these asymmetric interconnect patterns 116 are different from each other, the amounts of the conductive joining material HD flowing to the interconnect patterns 116 are different.

The thermistor element 140 becomes easy to detach from the arrangement pads 112.

As explained above, this embodiment overcomes these disadvantages.

Seventh Embodiment

FIGS. 22A and 22B to 25A to 25C are views of a piezoelectric device 700 of a seventh embodiment of the present invention.

FIG. 9 for the fourth embodiment is referred for a disassembled perspective view of the piezoelectric device 700 of the seventh embodiment.

FIGS. 21A and 21B for the sixth embodiment is referred for the interconnect patterns 116 for the thermistor element.

The piezoelectric device 700 of this embodiment differs from the sixth embodiment in the point that the cover 130 is connected to the ground.

The configuration of the piezoelectric device 700 of this embodiment is in common with or corresponds to that of the sixth embodiment except in the following explanation.

The thermistor element 140 is arranged in the second concave portion K2.

Figure 23:
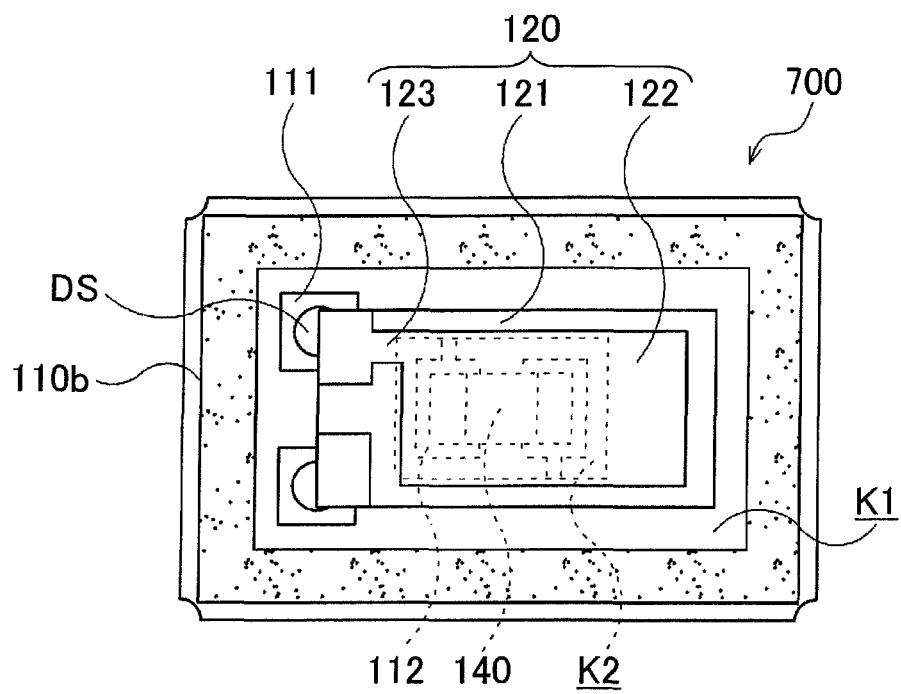
FIG. 23 is a plan view of the element arrangement member of the piezoelectric device of FIGS. 22A and 22B viewing from the side of the piezoelectric vibration element.

The thermistor element 140 is arranged in a space just under the excitation electrode section 122 in a plane view of FIG. 23, and is arranged so that its outer circumference does not protrude from the space.

Figure 24:
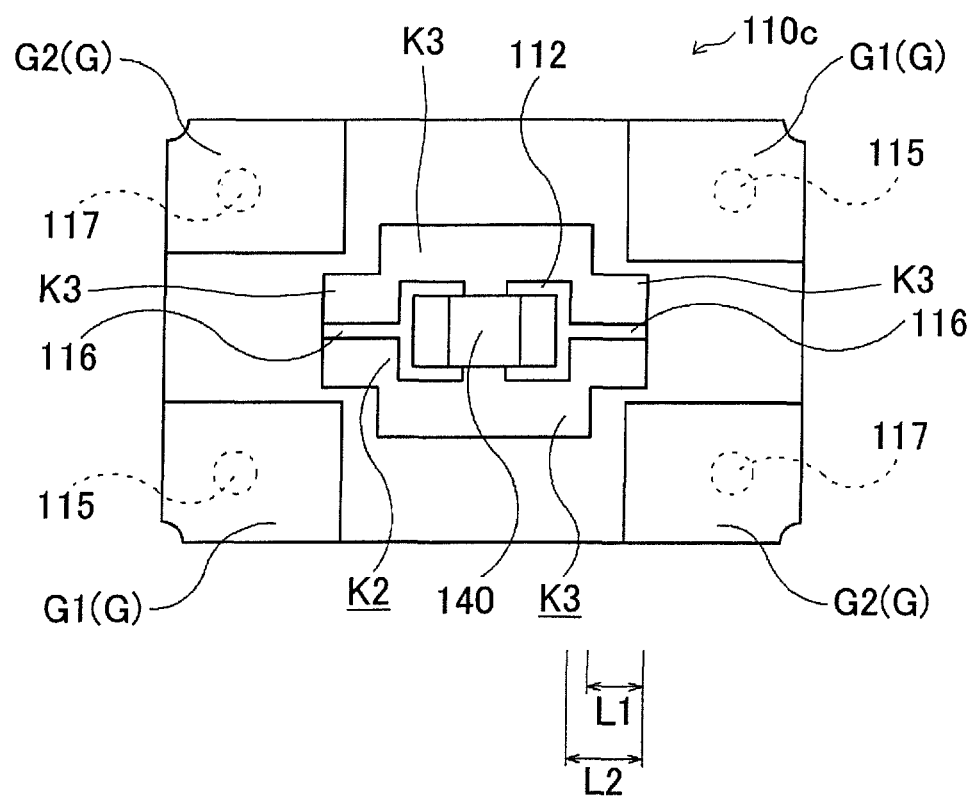
FIG. 24 is a plan view of the piezoelectric device of FIG. 22 viewing from the side of the thermistor element.

The thermistor element 140 is arranged in the second concave portion K2 as these long sides to be along with each other as shown in FIGS. 23 and 24.

The thermistor element 140 is arranged parallel to the long side direction of the element arrangement member 110.

Figure 22A:
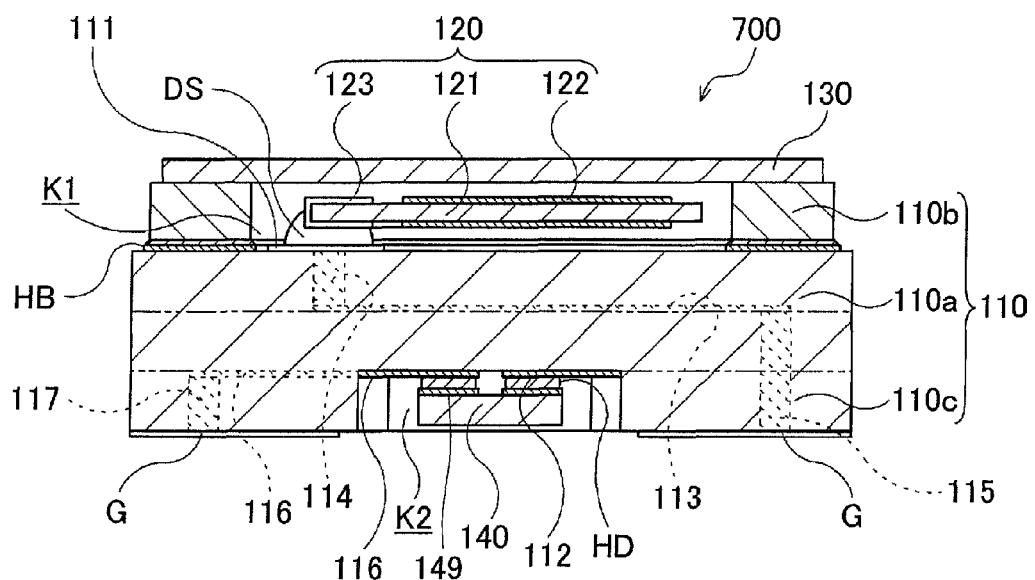
FIG. 22A is a cross-sectional view of a piezoelectric device of a seventh embodiment of the present invention corresponding to A-A of FIG. 9.
Figure 25A:
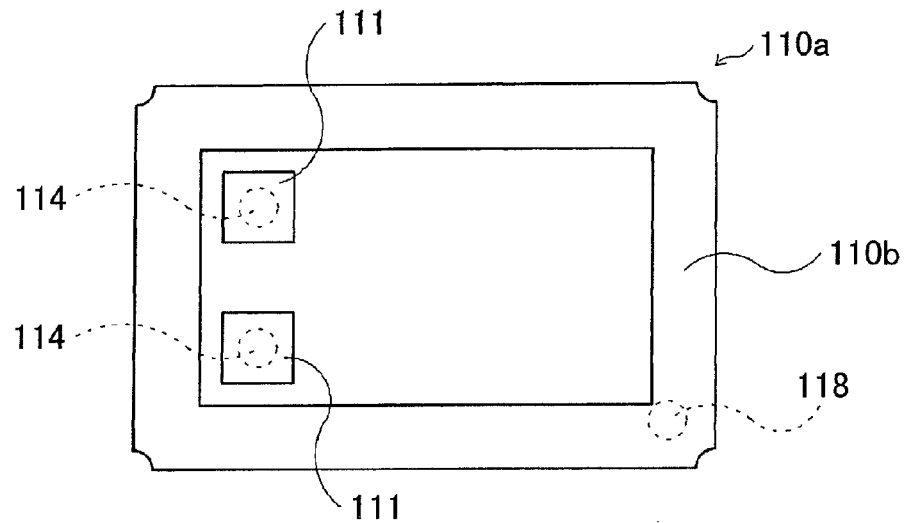
FIG. 25A is a plan view of the element arrangement member of the piezoelectric device of FIGS. 22A and 22B viewing from the side of one major surface.
Figure 25B:
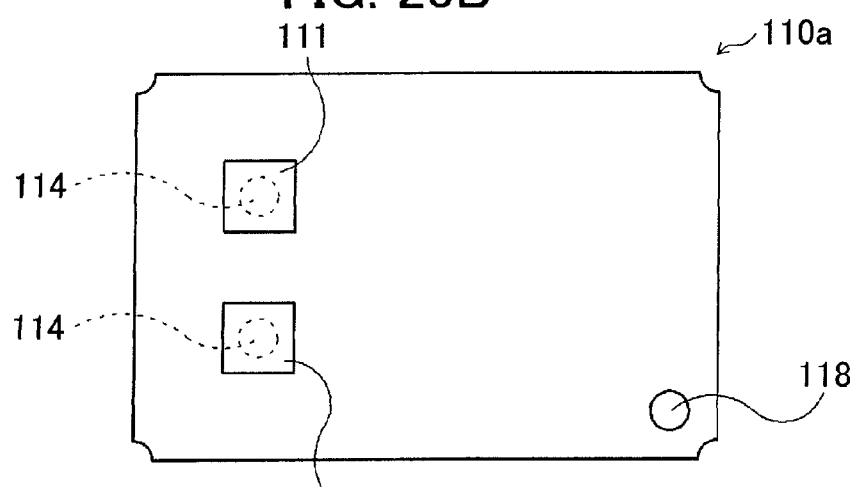
FIG. 25B is a plan view of the substrate portion of the piezoelectric device of FIGS. 22A and 22B viewing from the side of one major surface.
Figure 25C:
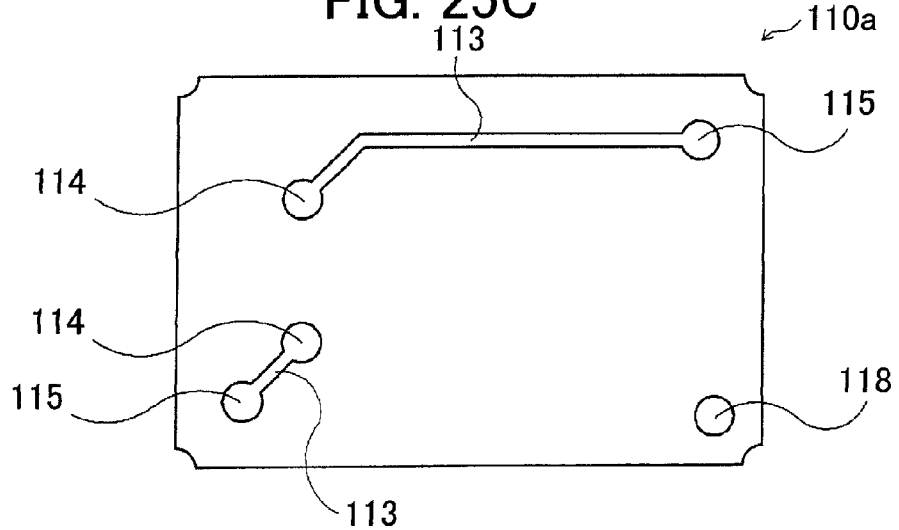
FIG. 25C is a plan view of the inner layer of the piezoelectric device of FIGS. 22A and 22B viewing from the side of one major surface.

As shown in FIGS. 22A and 25A, the first frame portion 110b is electrically connected to a pair of two electrode terminals G2 for the thermistor element through the third via-conductors 117 and fourth via-conductor 118.

The first frame portion 110b and one end of the thermistor element 140 are electrically connected by the third via-conductors 117.

One of the electrode terminals G2 is electrically connected to the cover 130.

The cover 130 can be connected to the ground.

Figure 22B:
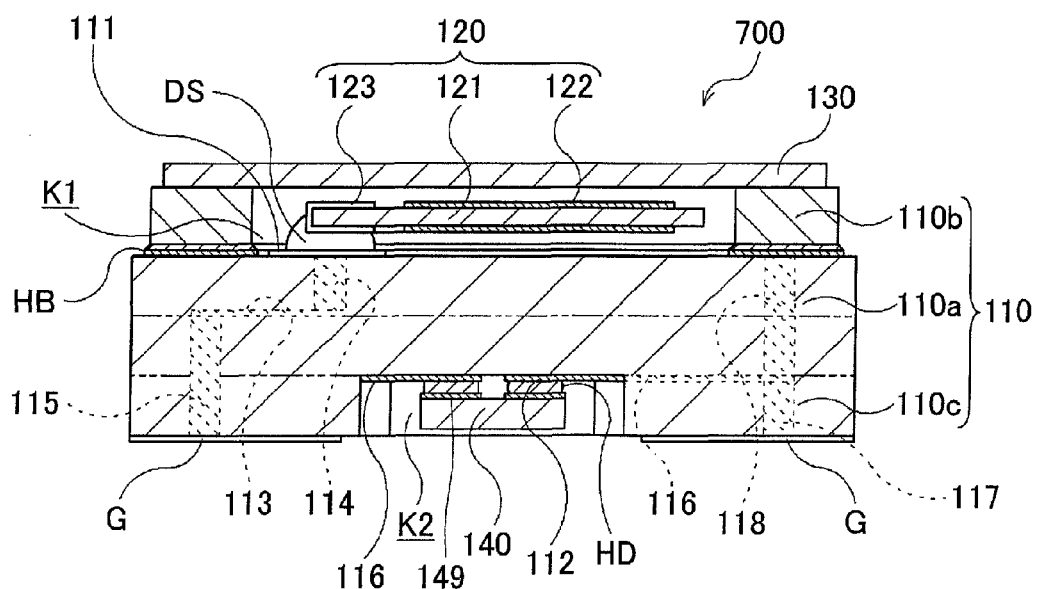
FIG. 22B is a cross-sectional view of the piezoelectric device in the opposite direction to A-A of FIG. 9.

As shown in FIG. 22B, the cover 130 is connected to the fourth via-conductor 118 through the first frame portion 110b.

The fourth via-conductor 118 is connected to one of the electrode terminals G2 through one of the third via-conductors 117.

Due to this, the cover 130 is electrically connected to one of the electrode terminals G2 for the thermistor element.

One of the electrode terminals G2 is connected to the ground.

The cover 130 is connected to the ground together with one of the pair of two electrode terminals G2.

The conductive binder DS is comprised of a binder of silicone resin containing a conductive filler of a conductive powder, for example.

The conductive powder is made of at least one type of material selected from among aluminum (Al), molybdenum (Mo), tungsten (W), platinum (Pt), palladium (Pd), silver (Ag), titanium (Ti), nickel (Ni), and nickel iron (NiFe), for example.

As described above, in this embodiment, the cover 130 is electrically connected to one of the electrode terminals G2 for the thermistor element.

By connection of the one electrode terminal G2 to the ground of the printed circuit board, for example, the cover 130 is connected to the ground.

A floating capacitor is not formed between the excitation electrode section 122 of the piezoelectric vibration element 120 and a external housing, even in a case where the ground of the external housing is located at close position of the cover 130.

The oscillation frequency of the piezoelectric vibration element 120 does not change.

In this embodiment, the thermistor element 140 is arranged in a space to be overlapped by the excitation electrode section 122 of the piezoelectric vibration element 120 in a plane view.

In this case, the thermistor element 140 is doubly shielded by the grounded cover 130 and the grounded excitation electrode section 122.

The superposition of noise on the thermistor element 140 is suppressed.

Further, the thermistor element 140 is located between the cover 130 connected to the ground and the excitation electrode section 122 and electrode terminals G2 connected to the ground.

As the thermistor element 140 is located between the grounds, the superposition of noise onto the thermistor element 140 becomes further harder.

The output value of the thermistor element 140 becomes more correct.

The correct voltage is output from the thermistor element 140, therefore the temperature difference between the detection temperature obtained by converting the output voltage of the thermistor element 140 and the actual temperature of the periphery of the piezoelectric vibration element 120 can be reduced.

As opposed to this, if the terminal for connecting the cover 130 to the ground is not provided, the cover 130 is in an electrically floating state.

If an external housing connected to the ground or other conductor approaches near to this floated cover 130, a floating capacitor is formed between the housing and the excitation electrode section 122 of the piezoelectric vibration element 120.

Due to the floating capacitor, the oscillation frequency of the piezoelectric vibration element 120 may change.

Further, there is no effective ground in the piezoelectric device 700, therefore noise is easily superposed on the thermistor element 140.

As explained above, this embodiment overcomes these disadvantages.

The above embodiments are preferred embodiments of the present invention. However, the present invention is not limited to the embodiments explained above. Various modifications or alterations are possible insofar as they are within the scope of the appended claims.

For example, the configurations of the embodiments explained above can be suitably combined or replaced by each other.

Specifically, in the fourth to seventh embodiments, the thermistor is used as a temperature detection unit. Other than this, in the piezoelectric devices of the fourth to seventh embodiments, temperature detecting IC devices 240 and 340 may be used as the temperature detection unit.

Other than this, in the embodiments, the piezoelectric vibration element 120 is joined by the conductive binder DS, and the thermistor element 140 or IC devices 240 and 340 are joined by the conductive joining material HD. Other than this, for example, the piezoelectric vibration element 120 may be joined by the conductive joining material HD, and the thermistor element 140 or IC devices 240 and 340 may be joined by the conductive binder DS.

Further, in the embodiments, the substrate portion 110a, first frame portion 110b, and the second frame portion 110c are integrally formed as the element arrangement member 110. Other than this, the substrate portion 110a, the first frame portion 110b, and the second frame portion 110c may be formed as separate bodies, for example.

In the embodiments explained above, the quartz plate 121 is used as the piezoelectric material of the piezoelectric vibration element 120. Other than this, a plate of lithium niobate, lithium tantalite, or piezoelectric ceramic may be used for the piezoelectric material of the piezoelectric vibration element 120, for example.

In the embodiments explained above, the first frame portion 110b of the element arrangement member 110 is made of metal, such as 42Alloy and Kovar, for example.

Other than this, the first frame portion 110b may be made of a ceramic material, for example.

In this case, the first concave portion K1 can be air-tightly sealed by forming a conductive sealing portion for on the major surface of the first frame portion 110b and joining the conductive sealing portion and a sealing member of the cover 130 by a conductive joining material such as solder.

The invention claimed is:

1. A piezoelectric vibrator, comprising:
    an element mounting member having a substrate portion, a first frame portion provided on one major surface of the substrate portion, and a second frame portion provided on the other major surface of the substrate portion;
    a piezoelectric vibration element mounted on a piezoelectric vibration element-mounting pad provided on the one major surface of the substrate, the one major surface being environmentally exposed in a space of a first concave portion formed by the substrate portion and the first frame portion;
    a thermistor element mounted on a thermistor element-mounting pad provided on the other major surface of the substrate, the other major surface being environmentally exposed in a space of a second concave portion formed by the substrate portion and the second frame portion; and
    a cover for hermetically sealing the space of the first concave portion, wherein
    electrode terminals for external connections are provided on at least four corners of a major surface of the second frame portion of the element mounting member, the major surface being opposite to a surface on which the piezoelectric vibration element-mounting pad is electrically connected only with a subset of the electrode terminals for external connections,
    the thermistor element-mounting pad is electrically connected only with another subset of the electrode terminals for external connections other than the subset of the electrode terminals for external connection with which the piezoelectric vibration element-mounting pad is electrically connected.

2. A piezoelectric vibrator as set forth in claim 1, wherein the substrate portion is made of a ceramic material.

3. A piezoelectric vibrator as set forth in claim 2, wherein the second frame portion is made of a ceramic material and is formed integrally with the substrate portion.

4. A piezoelectric vibrator as set forth in claim 1, wherein the electrode terminals for external connections include a pair of electrode terminals for the piezoelectric vibrator element and a pair of electrode terminals for the thermistor element,
    the electrode terminals for the piezoelectric vibrator element are provided at two corners adjacent to each other on the side of one short side of the second frame part, and the electrode terminals for the thermistor element are provided at the other two corners adjacent to each other on the side of the other short side of the second frame part,
    the electrode terminals for the piezoelectric vibrator element and the piezoelectric vibration element-mounting pad connect by interconnect patterns for the piezoelectric vibrator element provided in the substrate portion,
    the electrode terminals for the thermistor element and the thermistor element-mounting pad connect by interconnect patterns for the thermistor element provided in the substrate portion, and
    the interconnect patterns for the piezoelectric vibrator element and the interconnect patterns for the thermistor element are provided in the substrate portion without intersecting.

5. A piezoelectric vibrator as set forth in claim 1, wherein the electrode terminals for external connections include a pair of electrode terminals for the piezoelectric vibrator element and a pair of electrode terminals for the thermistor element, and
    in a state where the piezoelectric vibrator element and the thermistor element are mounted on the element mounting member, the thermistor element is positioned within exciting electrodes of the piezoelectric vibrator element in a plan view.

6. A piezoelectric vibrator as set forth in claim 1, further comprising a third concave portion formed around of the second concave portion, and
    wherein the thermistor element-mounting pad is environmentally exposed in the second concave portion.

7. A piezoelectric vibrator as set forth in claim 6, further comprising a pair of interconnect patterns formed on the other surface of the substrate portion environmentally exposed in the second concave portion and the third concave portion and connected to a pair of the thermistor element-mounting pads,
wherein:
    the exposed portions of the pair of interconnect patterns at the second concave portion and the third concave portion extend in the alignment direction of the pair of thermistor element-mounting pads, and
    the pair of second electrode members and the pair of thermistor element-mounting pads are arranged line symmetrically in the second concave portion.

8. A piezoelectric vibrator as set forth in claim 1, wherein the piezoelectric vibration element is mounted on a pair of the piezoelectric vibration element-mounting pads,
    the thermistor element is mounted on a pair of the thermistor element mounting pads,
    the electrode terminals for external connections at the four corners having a pair of electrode terminals for the piezoelectric vibrator element and a pair of electrode terminals for the thermistor element, the pair of the piezoelectric vibration element-mounting pads are electrically connected only with the pair of electrode terminals for the piezoelectric vibrator element, one of the pair of thermistor element mounting pads is electrically connected only with one of the pair of electrode terminals for the thermistor element, the other thermistor element mounting pad is electrically connected only with the other electrode terminals for the thermistor element, the other electrode terminal for the thermistor element is connected with ground.

9. A piezoelectric vibrator comprising:

an element mounting member having a substrate portion, a first frame portion provided on one major surface of the substrate portion, and a second frame portion provided on the other major surface of the substrate portion;

a piezoelectric vibration element mounted on a piezoelectric vibration element-mounting pad provided on the one major surface of the substrate, the one major surface being environmentally exposed in a space of a first concave portion formed by the substrate portion and the first frame portion;

a temperature sensor IC element including a built-in thermistor element and mounted on a temperature sensor IC element-mounting pad provided on the other major surface of the substrate, the other major surface being environmentally exposed in a space of a second concave portion formed by the substrate portion and the second frame portion; and a cover for hermetically sealing the space of the first concave portion, wherein electrode terminals for external connections are provided on at least four corners of a major surface of the second frame portion of the element mounting member, the major surface being opposite to a surface on which the piezoelectric vibration element-mounting pad is electrically connected only with a subset of the electrode terminals for external connections, the temperature sensor IC element-mounting pad is electrically connected only with another subset of the electrode terminals for external connections other than the subset of the electrode terminals for external connection with which the piezoelectric vibration element-mounting pad is electrically connected.

10. A piezoelectric device comprising:

an element mounting member having a substrate portion, a first frame portion provided on one major surface of the substrate portion, and a second frame portion provided on the other major surface of the substrate portion;

a piezoelectric vibration element mounted on a piezoelectric vibration element-mounting pad provided on the one major surface of the substrate, the one major surface being environmentally exposed in a space of a first concave portion formed by the substrate portion and the first frame portion;

a thermistor element mounted on a thermistor element-mounting pad provided on the other major surface of the substrate by using conductive joining material, the other major surface being environmentally exposed in a space of a second concave portion formed by the substrate portion and the second frame portion;

a pair of interconnect patterns for the thermistor element connected with thermistor element mounting pad;

a cover for hermetically sealing the space of the first concave portion;

electrode terminals for external connections having a pair of electrode terminals for the piezoelectric vibrator element and a pair of electrode terminals for the thermistor element at four corners of a surface of the second frame part, the surface facing in the same direction as the other major surface of the substrate part; and a space of a third concave portion provided between adjacent two of the electrode terminals for external connection on the side of the same side of the second frame portion of the element mounting member, wherein the pair of interconnect patterns for the thermistor element environmentally exposed on a bottom surface in the space of the second concave portion is parallel to long side outer circumferential edge portion of the element mounting member and is provided in a line symmetrical position to a center line which passes through a center point of the bottom surface in the space of the second concave portion and is parallel to a short side direction of a outer circumferential edge of the element mounting member, the relation between a diameter $L3$ of the conductive joining material before mounting thermistor element and a long side length $L2$ of the interconnect pattern for the thermistor element is $0.65 \leq L3/L2 \leq 0.85$.

11. A piezoelectric device as set forth in claim 10, wherein lengths of the pair of interconnect patterns for the thermistor element environmentally exposed on the bottom surface in the space of the second concave portion are equal.

* * * * *